US012640095B2

(12) United States Patent
Choi et al.

(10) Patent No.: US 12,640,095 B2
(45) Date of Patent: *May 26, 2026

(54) DISPLAY DEVICE

(71) Applicant: Samsung Display Co., Ltd., Yongin-si (KR)

(72) Inventors: Yoon Sun Choi, Yongin-si (KR); Won Suk Choi, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/934,859

(22) Filed: Nov. 1, 2024

(65) Prior Publication Data

US 2025/0061859 A1 Feb. 20, 2025

Related U.S. Application Data

(63) Continuation of application No. 18/355,694, filed on Jul. 20, 2023, now Pat. No. 12,136,392.

(30) Foreign Application Priority Data

Oct. 7, 2022 (KR) ........................ 10-2022-0128576
Feb. 27, 2023 (KR) ........................ 10-2023-0026025

(51) Int. Cl.
*G09G 3/3266* (2016.01)
*G09G 3/3233* (2016.01)
(Continued)

(52) U.S. Cl.
CPC ......... *G09G 3/3233* (2013.01); *G09G 3/3275* (2013.01); *H10K 59/131* (2023.02);
(Continued)

(58) Field of Classification Search
CPC .............. G09G 3/3233; G09G 3/3275; G09G 2300/0413; G09G 2300/0426;
(Continued)

(56) References Cited

U.S. PATENT DOCUMENTS

2016/0232837 A1* 8/2016 Lee ...................... G09G 3/3275
2017/0287394 A1* 10/2017 Kim ..................... H10K 59/131
(Continued)

*Primary Examiner* — Abdul-Samad A Adediran
(74) *Attorney, Agent, or Firm* — Harness, Dickey & Pierce, P.L.C.

(57) ABSTRACT

A display device includes a substrate, a circuit layer, and a light emitting element layer. The circuit layer includes pixel drivers corresponding to emission areas of a display area of the substrate and electrically connected to light emitting elements of the light emitting element layer, data lines that transmit data signals to the pixel drivers, first dummy lines disposed in the display area and extending in a first direction intersecting the data lines, and second dummy lines extending in a second direction parallel to the data lines and neighboring the data lines on a side in the first direction. A subset of via holes among via holes through which the first dummy lines and the second dummy lines are electrically connected, overlaps one of the emission areas, and another subset via holes are disposed in a non-emission area between the emission areas.

20 Claims, 22 Drawing Sheets

(51) Int. Cl.

| | |
|---|---|
| *G09G 3/3275* | (2016.01) |
| *H10K 59/131* | (2023.01) |
| *H10K 59/88* | (2023.01) |

(52) U.S. Cl.
CPC ..... *H10K 59/88* (2023.02); *G09G 2300/0413* (2013.01); *G09G 2300/0426* (2013.01); *G09G 2300/0819* (2013.01); *G09G 2300/0842* (2013.01); *G09G 2310/0297* (2013.01); *G09G 2330/021* (2013.01)

(58) Field of Classification Search
CPC ... G09G 2300/0819; G09G 2300/0842; G09G 2310/0297; G09G 2330/021; G09G 3/20; H10K 59/131; H10K 59/88; H10D 86/60
See application file for complete search history.

(56) References Cited

U.S. PATENT DOCUMENTS

| | | | |
|---|---|---|---|
| 2021/0020724 A1 * | 1/2021 | Cho ..................... | H10D 86/60 |
| 2022/0246712 A1 * | 8/2022 | Cho ..................... | G09G 3/20 |
| 2023/0189590 A1 | 6/2023 | Choi et al. | |

* cited by examiner

DAA : DMDA, DSDA1, DSDA2

DXA : XMA, XSA1, XSA2

DMC : DMC1, DMC2, DMC3

DSPL : DSPL1, DSPL2, DSPL3

DL : DL1, DL2, DL3, DL4, DL5, DL6

IDEL : DETL1, DETL2, DETL3

DML1 : DETL2, ASL1

DML2 : DETL1, DETL2, ASL2

ASL2 : GASL, EASL1, EASL2

FIG. 6

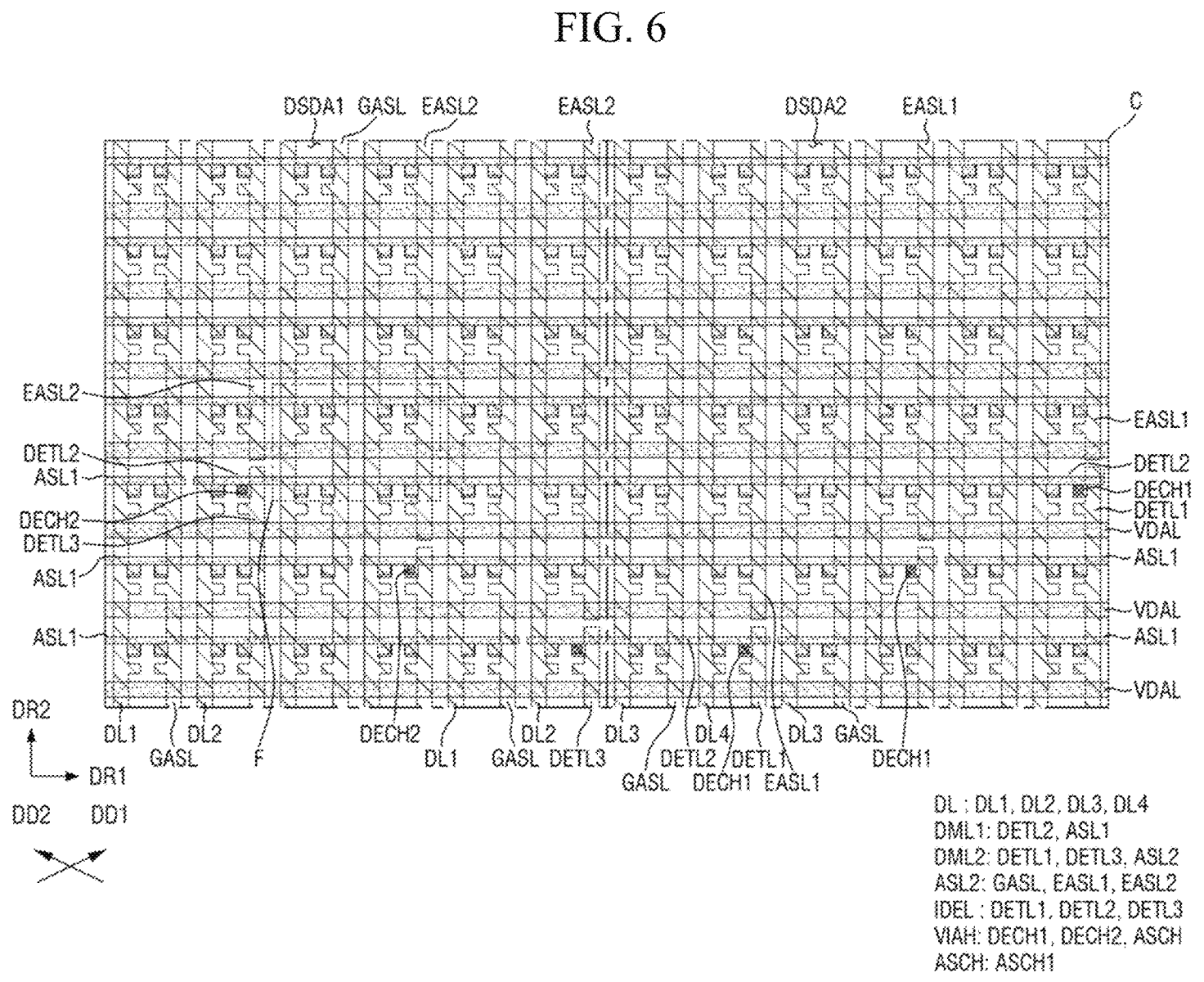

DL : DL1, DL2, DL3, DL4
DML1: DETL2, ASL1
DML2: DETL1, DETL3, ASL2
ASL2: GASL, EASL1, EASL2
IDEL : DETL1, DETL2, DETL3
VIAH: DECH1, DECH2, ASCH
ASCH: ASCH1

CDL4: DML1, VDAL, CE4, CE5
CDL5: DL, DML2, CE6
DML1: DETL2, ASL1
DML2: DETL1, DETL3, ASL2
ASL2: GASL, EASL1, EASL2
IDEL : DETL1, DETL2, DETL3

SEL: CHDT, SDT, DDT, CH11, S11, D11,CH12, S12, D12,
CH2, S2, D2, CH31, S31, D31,CH32, S32, D32,
CH4, S4, D4, CH5, S5, D5, CH6, S6, D6
CDL1: GWL, GIL, ECL, GCL, GDT, G11, G12, G2, G31, G32, G4, G5, G6
CDL2: VDSBL1, VGIL, VAIL, SHE
CDL3: VDSBL2, VGIAL, VAIAL, CE1, CE2, CE3
VDL: VDSBL1, VDSBL2

Figure 15:
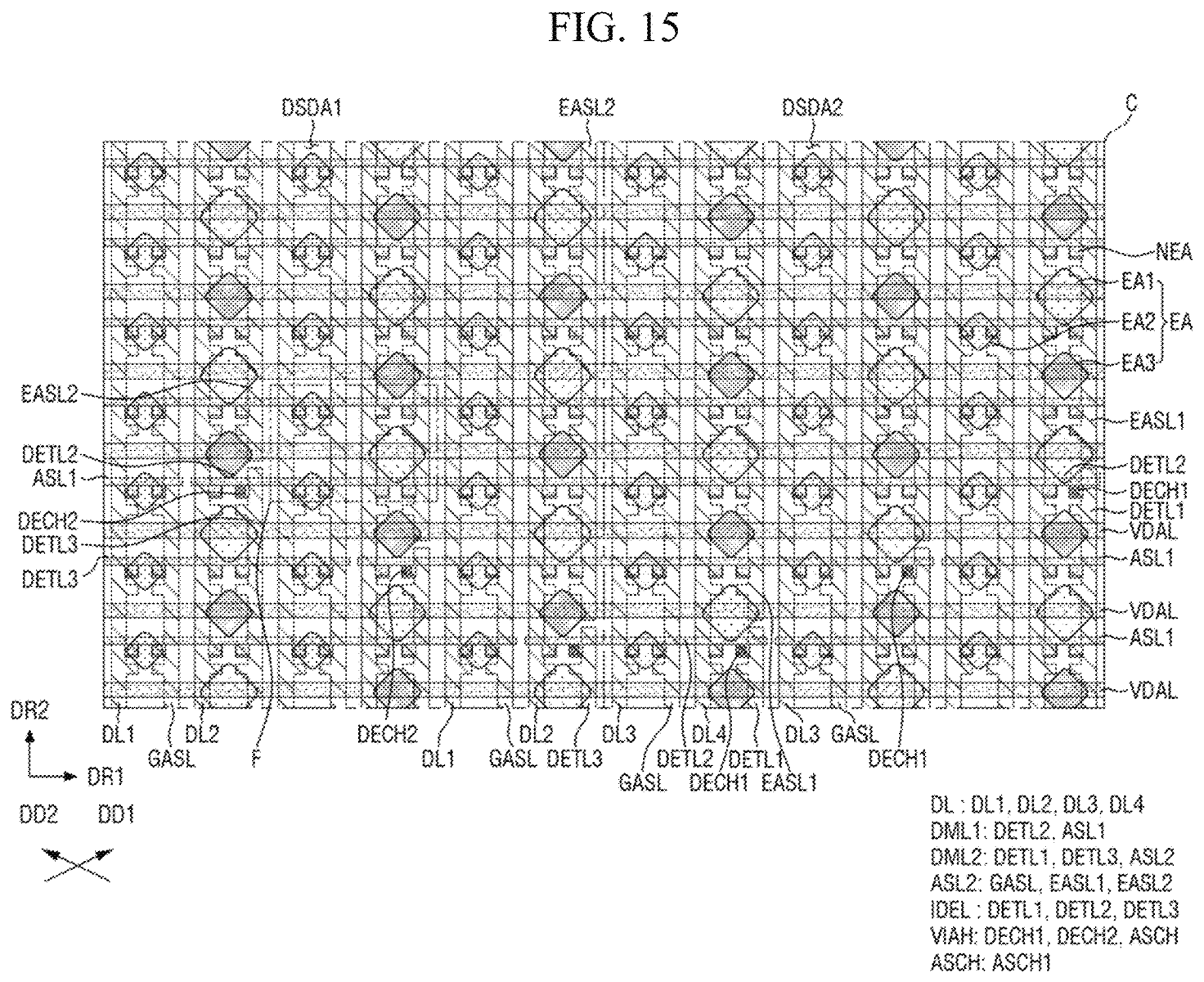

DL : DL1, DL2, DL3, DL4
DML1: DETL2, ASL1
DML2: DETL1, DETL3, ASL2
ASL2: GASL, EASL1, EASL2
IDEL : DETL1, DETL2, DETL3
VIAH: DECH1, DECH2, ASCH
ASCH: ASCH1

DML1: DET1.2, ASL1
DML2: DET1.1, DET1.3, ASL2
ASL2: GASL, EASL1, EASL2
VIAH: DECH1, DECH2, ASCH
ASCH: ASCH1, ASCH2, ASCH3

DML1: DETL2, ASL1
DML2: DETL1, DETL3, ASL2
ASL2: GASL, EASL1, EASL2
DEL: DETL1, DETL2, DETL3
VIAH: DECH1, DECH2, ASCH
ASCH : ASCH1

FIG. 18

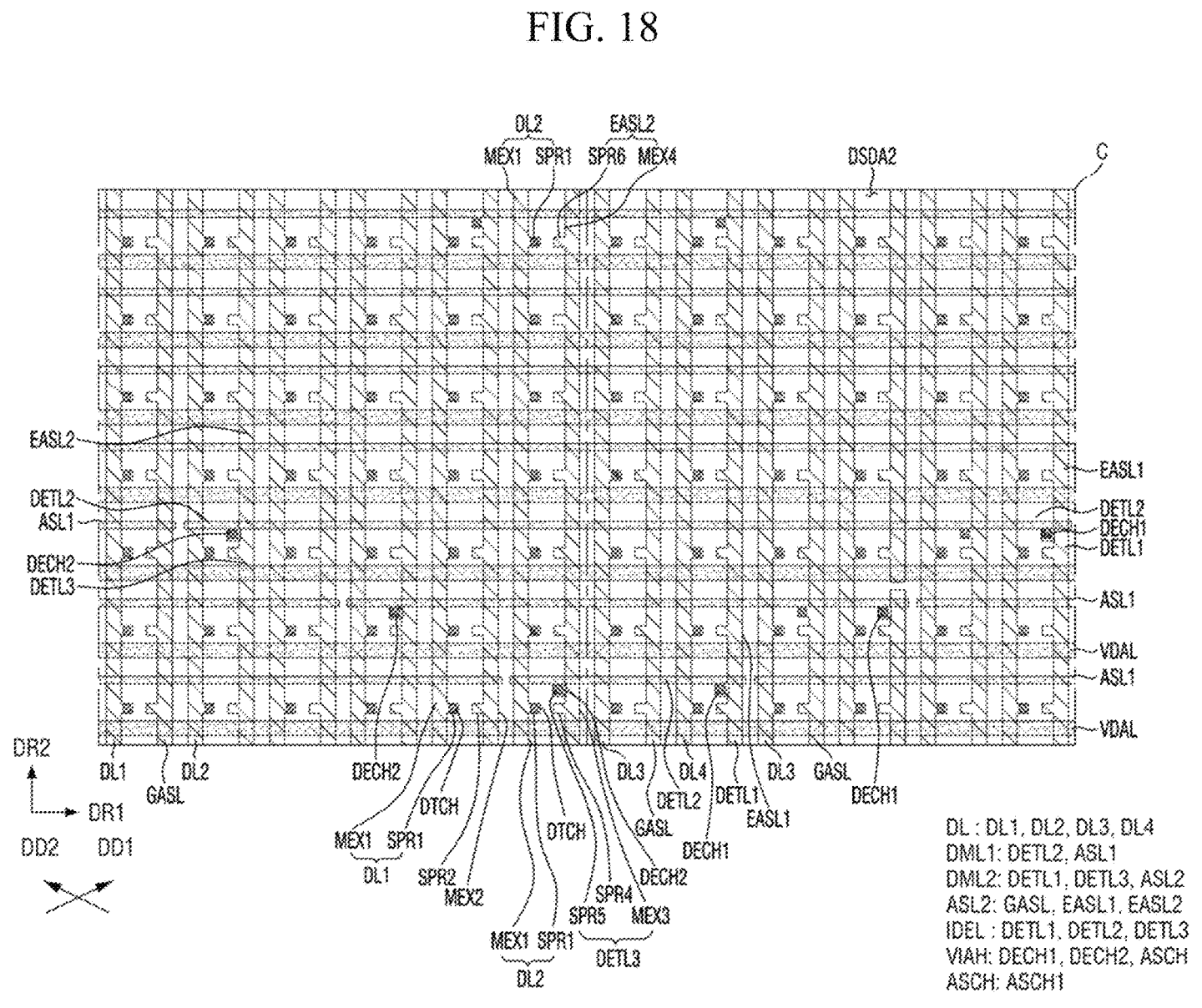

DL : DL1, DL2, DL3, DL4
DML1: DETL2, ASL1
DML2: DETL1, DETL3, ASL2
ASL2: GASL, EASL1, EASL2
IDEL : DETL1, DETL2, DETL3
VIAH: DECH1, DECH2, ASCH
ASCH: ASCH1

DML1: DETL2, ASL1
DML2: DETL1, DETL3, ASL2
ASL2: GASL, EASL1, EASL2
IDEL: DETL1, DETL2, DETL3
VIAH: DECH1, DECH2, ASCH
ASCH : ASCH1

FIG. 22

DML1: DETL2, ASL1
DML2: DETL1, DETL3, ASL2
ASL2: GASL, EASL1, EASL2
IDEL: DETL1, DETL2, DETL3
VIAH: DECH1, DECH2, ASCH
ASCH : ASCH1

DISPLAY DEVICE

CROSS-REFERENCE TO RELATED APPLICATION(S)

This is a continuation application of U.S. patent application Ser. No. 18/355,694 filed Jul. 20, 2023 (now pending), the disclosure of which is incorporated herein by reference in its entirety. U.S. patent application Ser. No. 18/355,694 claims priority to and benefits of Korean Patent Application No. 10-2022-0128576 and 10-2023-0026025 under 35 U.S.C. § 119, filed on Oct. 7, 2022 and Feb. 27, 2023, respectively, in the Korean Intellectual Property Office, the entire contents of which are incorporated herein by reference.

BACKGROUND

1. Technical Field

The disclosure relates to a display device.

2. Description of the Related Art

As information society develops, demands for display devices for displaying images are increasing in various forms. For example, display devices are applied to various electronic devices such as smartphones, digital cameras, notebook computers, navigation devices, and smart televisions.

A display device may include a display panel that emits light for displaying an image and a driver that supplies signals or power for driving the display panel.

At least one surface of the display device may be referred to as a display surface on which an image may be displayed. The display surface may include a display area in which emission areas emitting light for displaying an image are disposed and a non-display area disposed around the display area.

The display device may include data lines disposed in the display area and transmitting data signals to pixel drivers respectively corresponding to the emission areas and a display driving circuit supplying the data signals to the data lines, respectively.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

A display device may include data supply lines electrically connected to output terminals of the display driving circuit, respectively, and disposed in the non-display area. In case that the data supply lines are electrically connected to the data lines, respectively, it is difficult to reduce a width of the non-display area because the number of data supply lines increases as the number of data lines is increased to increase size or improve resolution.

In other embodiments, if the width of the non-display area is reduced to increase the proportion of the display area in the display surface of the display device, a distance between the data supply lines is reduced, thus causing a short-circuit defect.

Aspects of the disclosure provide a display device in which a width of a non-display area can be reduced without reducing resolution or causing a short-circuit defect.

However, aspects of the disclosure are not restricted to the one set forth herein. The above and other aspects of the disclosure will become more apparent to one of ordinary skill in the art to which the disclosure pertains by referencing the detailed description of the disclosure given below.

According to an aspect of the disclosure, there is provided a display device which may include a substrate comprising a main area which comprises a display area including emission areas, and a non-display area disposed around the display area, and a sub-area protruding from a side of the main area. The display device may include a circuit layer disposed on the substrate, and a light emitting element layer disposed on the circuit layer and comprising light emitting elements in the emission areas. The circuit layer may include pixel drivers corresponding to the emission areas and electrically connected to the light emitting elements, data lines that transmit data signals to the pixel drivers, first dummy lines disposed in the display area and extending in a first direction intersecting the data lines, and second dummy lines extending in a second direction parallel to the data lines and neighboring the data lines on a side in the first direction. A subset of via holes among via holes through which the first dummy lines and the second dummy lines are electrically connected, may overlap one of the emission areas, and another subset of via holes may be disposed in a non-emission area between the emission areas.

The display device may further include a display driving circuit disposed on the substrate in the sub-area and supplying data driving signals corresponding to the data signals of the data lines of the circuit layer. The circuit layer may further include demultiplexer (demux) circuits disposed in a demux area of the non-display area which is adjacent to the sub-area, and electrically connected between the display driving circuit and the data lines. One of the demux circuits may include an input terminal electrically connected to the display driving circuit, and a first output terminal and a second output terminal that are electrically connected to two of the data lines, respectively.

The demux area may include a demux middle area in the middle, a first demux side area adjacent to a bent portion of an edge of the substrate, and a second demux side area disposed between the demux middle area and the first demux side area. The demux circuits may include a first demux circuit disposed in the first demux side area, and a second demux circuit disposed in the second demux side area. The circuit layer may further include data supply lines electrically connected to output terminals of the display driving circuit. A first data supply line among the data supply lines may extend from the sub-area to the second demux side area and may be electrically connected to an input terminal of the first demux circuit through an input detour line disposed in the display area, and a second data supply line among the data supply lines may extend from the sub-area to the second demux side area and may be electrically connected to an input terminal of the second demux circuit.

A demux adjacent area of the display area which is adjacent to the demux area may include a display middle area adjacent to the demux middle area, a first display side area adjacent to the first demux side area, and a second display side area adjacent to the second demux side area. The input detour line may include a first detour line disposed in the second display side area, extending in the second direction and electrically connected to the first data supply line, a second detour line extending in the first direction in the second display side area and the first display side area and electrically connected to the first detour line, and a third detour line disposed in the first display side area, extending toward the first demux side area in the second direction and electrically connected to the second detour line. The first dummy lines may include the second detour line, and the second dummy lines comprise the first detour line and the third detour line.

The circuit layer may further include a first power supply line and a second power supply line disposed in the sub-area and the non-display area and respectively transmitting first power and second power for driving the light emitting elements and first power auxiliary lines disposed in the display area, extending in the first direction and electrically connected to the first power supply line. The first dummy lines may further include first auxiliary lines electrically connected to the second power supply line. The second dummy lines may further include second auxiliary lines electrically connected to the second power supply line.

The display area may further include a general area disposed between the demux adjacent area and the non-display area in the second direction. The general area may include a general middle area adjacent to the display middle area, a first general side area adjacent to the first display side area, and a second general side area adjacent to the second display side area. The first detour line may extend in the second direction between the first data supply line and the second detour line, the second detour line may extend in the first direction between the first detour line and the third detour line, and the third detour line may extend in the second direction between the first demux side area and the second detour line. The second auxiliary lines may include general auxiliary lines extending between both ends of the display area in the second direction, a first extension auxiliary line spaced apart from an end of the first detour line in the second direction and extending to the second general side area, and a second extension auxiliary line spaced apart from an end of the third detour line in the second direction and extending to the first general side area.

The data lines may include a first data line and a second data line that are electrically connected to a first output terminal and a second output terminal of the first demux circuit, respectively, and disposed in the first display side area and the first general side area, and a third data line and a fourth data line electrically connected to a first output terminal and a second output terminal of the second demux circuit, respectively, and disposed in the second display side area and the second general side area. Each of the first data line and the third data line may neighbor one of the general auxiliary lines on the side in the first direction, the second data line may neighbor the third detour line and the second extension auxiliary line on the side in the first direction, and the fourth data line may neighbor the first detour line and the first extension auxiliary line on the side in the first direction.

The via holes may include a first detour connection hole through which the first detour line and the second detour line may be electrically connected; a second detour connection hole through which the second detour line and the third detour line may be electrically connected; and auxiliary connection holes through which the first auxiliary lines and the second auxiliary lines may be electrically connected.

The auxiliary connection holes may include first auxiliary connection holes overlapping the general auxiliary lines, the first detour connection hole and the second detour connection hole may be disposed in the non-emission area, and each of the first auxiliary connection holes may overlap one of the emission areas.

The auxiliary connection holes may further include a second auxiliary connection hole disposed in the first general side area and overlapping the second extension auxiliary line, and a third auxiliary connection hole disposed in the second general side area and overlapping the first extension auxiliary line. The second auxiliary connection hole and the third auxiliary connection hole may be disposed in the non-emission area.

The first extension auxiliary line and the second extension auxiliary line may be electrically connected to the second power supply line in the non-display area.

The auxiliary connection holes may include first auxiliary connection holes overlapping the general auxiliary lines, each of the first detour connection hole and the second detour connection hole may overlap one of the emission areas, and the first auxiliary connection holes may be disposed in the non-emission area.

First detour connection holes respectively overlapping adjacent second detour lines in the second direction may be disposed in a first diagonal direction intersecting the first direction and the second direction. Second detour connection holes respectively overlapping second detour lines adjacent thereto in the second direction may be disposed in a second diagonal direction symmetrical to the first diagonal direction.

Each of the pixel drivers may be electrically connected to one of the data lines through a data connection hole. Each of the first data line and the second data line may include a first main extension portion extending in the second direction, and a first sub-protrusion protruding from the first main extension portion and overlapping the data connection hole. A general auxiliary line neighboring the first data line may include a second main extension portion extending in the second direction, a second sub-protrusion protruding from the second main extension portion and facing the first sub-protrusion of the first data line, and a third sub-protrusion facing the first main extension portion of the first data line and overlapping one first auxiliary connection hole among the auxiliary connection holes. The third detour line neighboring the second data line may include a third main extension portion extending in the second direction, a fourth sub-protrusion protruding from the third main extension portion and facing the first sub-protrusion of the second data line, and a fifth sub-protrusion protruding from the third main extension portion, facing the first main extension portion of the second data line and overlapping the second detour connection hole.

The second extension auxiliary line neighboring the second data line may include a fourth main extension portion extending in the second direction and a sixth sub-protrusion protruding from the fourth main extension portion and facing the first sub-protrusion of the second data line. The fourth main extension portion may be electrically connected to the second power supply line in the non-display area.

The second extension auxiliary line neighboring the second data line may further include a seventh sub-protrusion protruding from the fourth main extension portion, facing the first main extension portion of the second data line, and overlapping another auxiliary connection hole among the auxiliary connection holes.

According to an aspect of the disclosure, there is provided a display device which may include a substrate including a main area, which may include a display area including emission areas, and a non-display area disposed around the display area, and a sub-area protruding from a side of the main area. The display device may include a circuit layer disposed on the substrate, a light emitting element layer disposed on the circuit layer and comprising light emitting elements in the emission areas, and a display driving circuit disposed on the substrate in the sub-area and supplying data driving signals corresponding to the data signals of the data lines of the circuit layer. The circuit layer may include pixel drivers corresponding to the emission areas and electrically connected to the light emitting elements, data lines that transmit data signals to the pixel drivers, first dummy lines disposed in the display area and extending in a first direction intersecting the data lines, second dummy lines extending in a second direction parallel to the data lines and neighboring the data lines on a side in the first direction, demux circuits disposed in a demux area of the non-display area which is adjacent to the sub-area, data supply lines electrically connected to output terminals of the display driving circuit, a first power supply line and a second power supply line that are disposed in the sub-area and the non-display area and that respectively transmit first power and second power for driving the light emitting elements, and first power auxiliary lines disposed in the display area, extending in the first direction, and electrically connected to the first power supply line. The demux area may include a demux middle area in the middle, a first demux side area adjacent to a bent portion of an edge of the substrate, and a second demux side area disposed between the demux middle area and the first demux side area. A demux adjacent area of the display area which is adjacent to the demux area may include a display middle area adjacent to the demux middle area, a first display side area adjacent to the first demux side area, and a second display side area adjacent to the second demux side area. The demux circuits may include a first demux circuit disposed in the first demux side area, and a second demux circuit disposed in the second demux side area. A first data supply line among the data supply lines may extend from the sub-area to the second demux side area and may be electrically connected to an input terminal of the first demux circuit through an input detour line disposed in the display area. A second data supply line among the data supply lines may extend from the sub-area to the second demux side area and may be electrically connected to an input terminal of the second demux circuit. The input detour line may include a first detour line disposed in the second display side area, extending in the second direction and electrically connected to the first data supply line, a second detour line extending in the first direction in the second display side area and the first display side area and electrically connected to the first detour line, and a third detour line disposed in the first display side area, extending toward the first demux side area in the second direction and electrically connected to the second detour line. The first dummy lines may include the second detour line and first auxiliary lines. The second dummy lines may include the first detour line, the third detour line and second auxiliary lines. The first auxiliary lines and the second auxiliary lines may be electrically connected to the second power supply line. A first detour connection hole through which the first detour line and the second detour line may be electrically connected, may overlap one of the emission areas. A second detour connection hole through which the third detour line and the second detour line may be electrically connected, may overlap another one of the emission areas. Auxiliary connection holes through which the first auxiliary lines and the second auxiliary lines may be electrically connected, may be disposed in a non-emission area between the emission areas.

The display area may further include a general area disposed between the demux adjacent area and the non-display area in the second direction. The general area may include a general middle area adjacent to the display middle area, a first general side area adjacent to the first display side area, and a second general side area adjacent to the second display side area. The first detour line may extend in the second direction between the first data supply line and the second detour line. The second detour line may extend in the first direction between the first detour line and the third detour line. The third detour line may extend in the second direction between the first demux side area and the second detour line. The second auxiliary lines may include general auxiliary lines extending between both ends of the display area in the second direction, a first extension auxiliary line spaced apart from an end of the first detour line in the second direction and extending to the second general side area and a second extension auxiliary line spaced apart from an end of the third detour line in the second direction and extending to the first general side area. The data lines may include a first data line and a second data line that are electrically connected to the first demux circuit and disposed in the first display side area and the first general side area, and a third data line and a fourth data line that are electrically connected to the second demux circuit and disposed in the second display side area and the second general side area. Each of the first data line and the third data line may neighbor one of the general auxiliary lines on the side in the first direction. The second data line may neighbor the third detour line and the second extension auxiliary line on the side in the first direction. The fourth data line may neighbor the first detour line and the first extension auxiliary line on the side in the first direction.

The first extension auxiliary line and the second extension auxiliary line may be electrically connected to the second power supply line in the non-display area.

Each of the pixel drivers may be electrically connected to one of the data lines through a data connection hole. Each of the first data line and the second data line may include a first main extension portion extending in the second direction and a first sub-protrusion protruding from the first main extension portion and overlapping the data connection hole. A general auxiliary line neighboring the first data line may include a second main extension portion extending in the second direction, a second sub-protrusion protruding from the second main extension portion and facing the first sub-protrusion of the first data line, and a third sub-protrusion facing the first main extension portion of the first data line and overlapping one of the auxiliary connection holes. The third detour line neighboring the second data line may include a third main extension portion extending in the second direction, a fourth sub-protrusion protruding from the third main extension portion and facing the first sub-protrusion of the second data line, and a fifth sub-protrusion protruding from the third main extension portion, facing the first main extension portion of the second data line and overlapping the second detour connection hole. The second extension auxiliary line neighboring the second data line may include a fourth main extension portion extending in the second direction, and a sixth sub-protrusion protruding from the fourth main extension portion and facing the first sub-protrusion of the second data line. The fourth main extension portion may be electrically connected to the second power supply line in the non-display area.

The effects of the disclosure are not limited to the aforementioned effects, and various other effects are included in the specification.

BRIEF DESCRIPTION OF THE DRAWINGS

These and/or other aspects will become apparent and more readily appreciated from the following description of the embodiments, taken in conjunction with the accompanying drawings in which:

FIG. 6 is a schematic plan view illustrating an example of data lines, first dummy lines, second dummy lines, and first power auxiliary lines disposed in portion C of FIGS. 4 and 5;

FIG. 14 is a schematic plan view illustrating an example of emission areas disposed in portion C of FIGS. 4 and 5;

FIG. 15 is a schematic plan view illustrating emission areas and via holes disposed in portion C of FIGS. 4 and 5 in a display device according to an embodiment;

FIG. 18 is a schematic plan view illustrating data lines, first dummy lines, second dummy lines, and via holes disposed in portion C of FIGS. 4 and 5 in a display device according to yet another embodiment;

FIG. 22 is a schematic plan view illustrating data lines, first dummy lines, second dummy lines, and via holes disposed in portion E of FIG. 4 in a display device according to another embodiment.

DETAILED DESCRIPTION OF THE EMBODIMENTS

Figure 1:
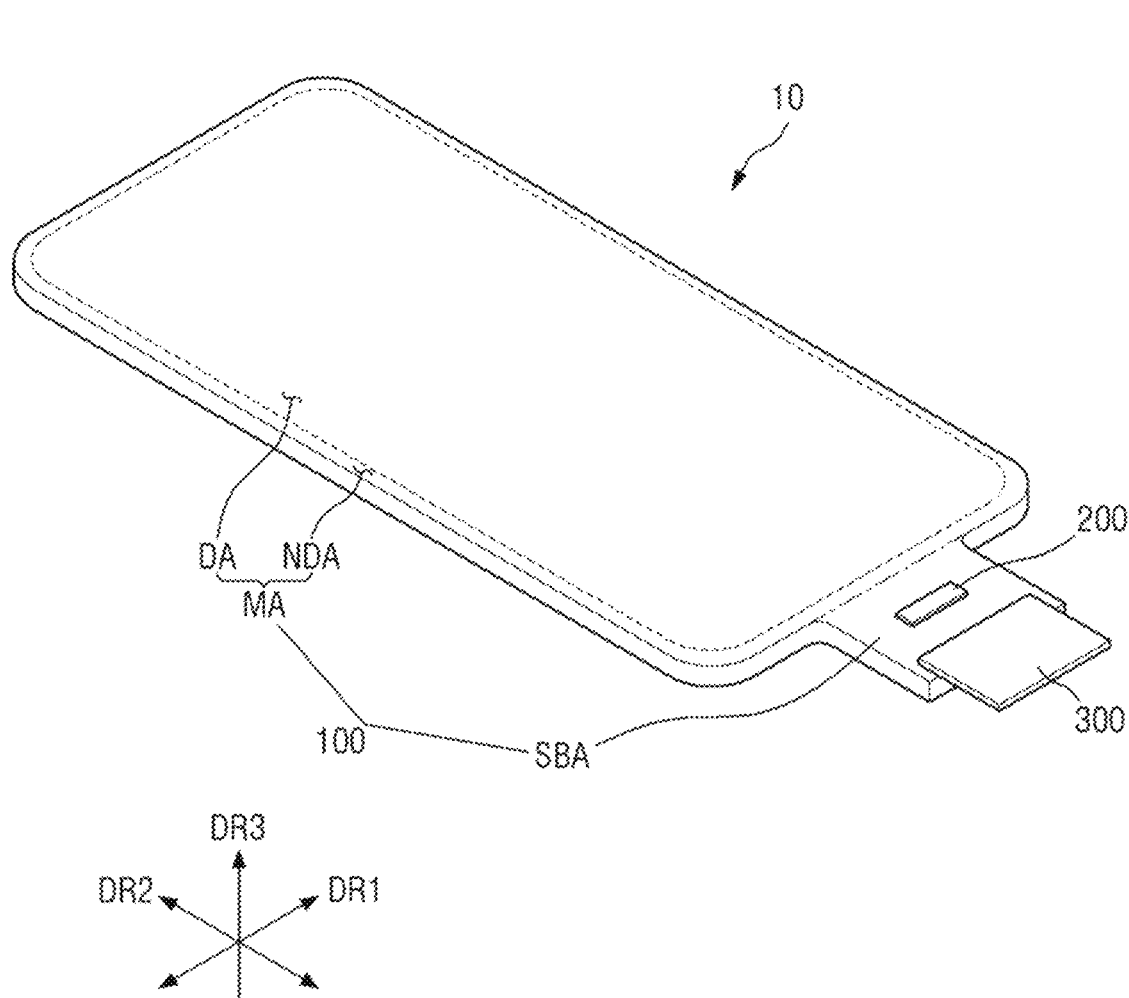
FIG. 1 is a schematic perspective view of a display device according to an embodiment.

The embodiments will now be described more fully hereinafter with reference to the accompanying drawings. The embodiments may, however, be provided in different forms and should not be construed as limiting. The same reference numbers indicate the same components throughout the disclosure. In the accompanying figures, the thickness of layers and regions may be exaggerated for clarity.

Some of the parts which are not associated with the description may not be provided in order to describe embodiments of the disclosure.

As used herein, the singular forms, "a," "an," and "the" are intended to include the plural forms as well, unless the context clearly indicates otherwise.

It will also be understood that when a layer is referred to as being "on" another layer or substrate, it can be directly on the other layer or substrate, or intervening layers may also be present. In contrast, when an element is referred to as being "directly on" another element, there may be no intervening elements present.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

The spatially relative terms "below," "beneath," "lower," "above," "upper," or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

It will be further understood that when the terms "comprises," "comprising," "has," "have," "having," "includes" and/or "including" are used, they may specify the presence of stated features, integers, steps, operations, elements and/or components, but do not preclude the presence or addition of other features, integers, steps, operations, elements, components, and/or any combination thereof.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein.

The terms "about" or "approximately" or "substantially" as used herein are inclusive of the stated value and mean within an acceptable range of deviation for the particular value as determined by one of ordinary skill in the art, considering the measurement in question and the error associated with measurement of the particular quantity (for example, the limitations of the measurement system). For example, "about" may mean within one or more standard deviations, or within +30%, 20%, 10%, 5% of the stated value.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined or implied, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Figure 2:
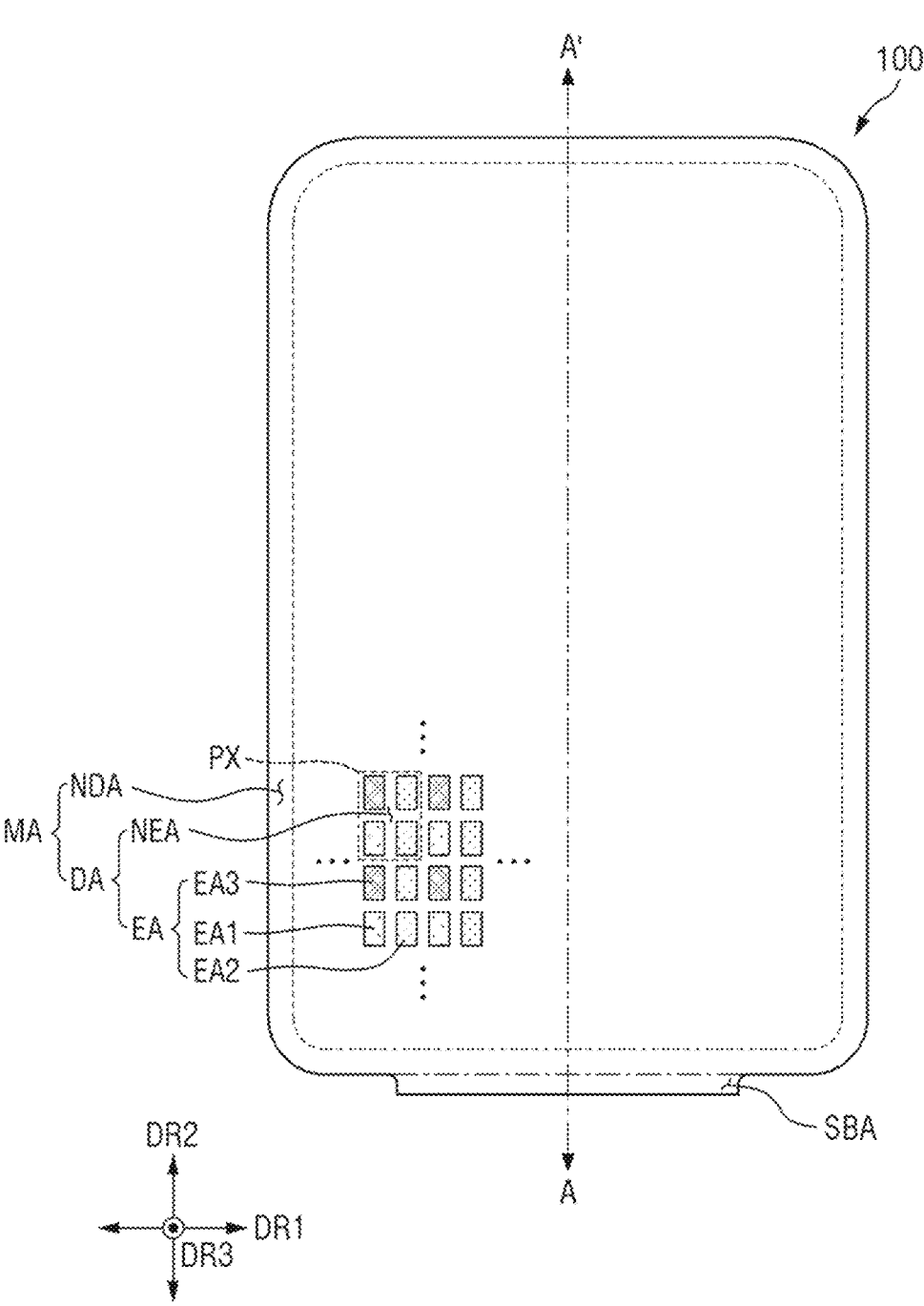
FIG. 2 is a schematic plan view of the display device of FIG. 1.
Figure 3:
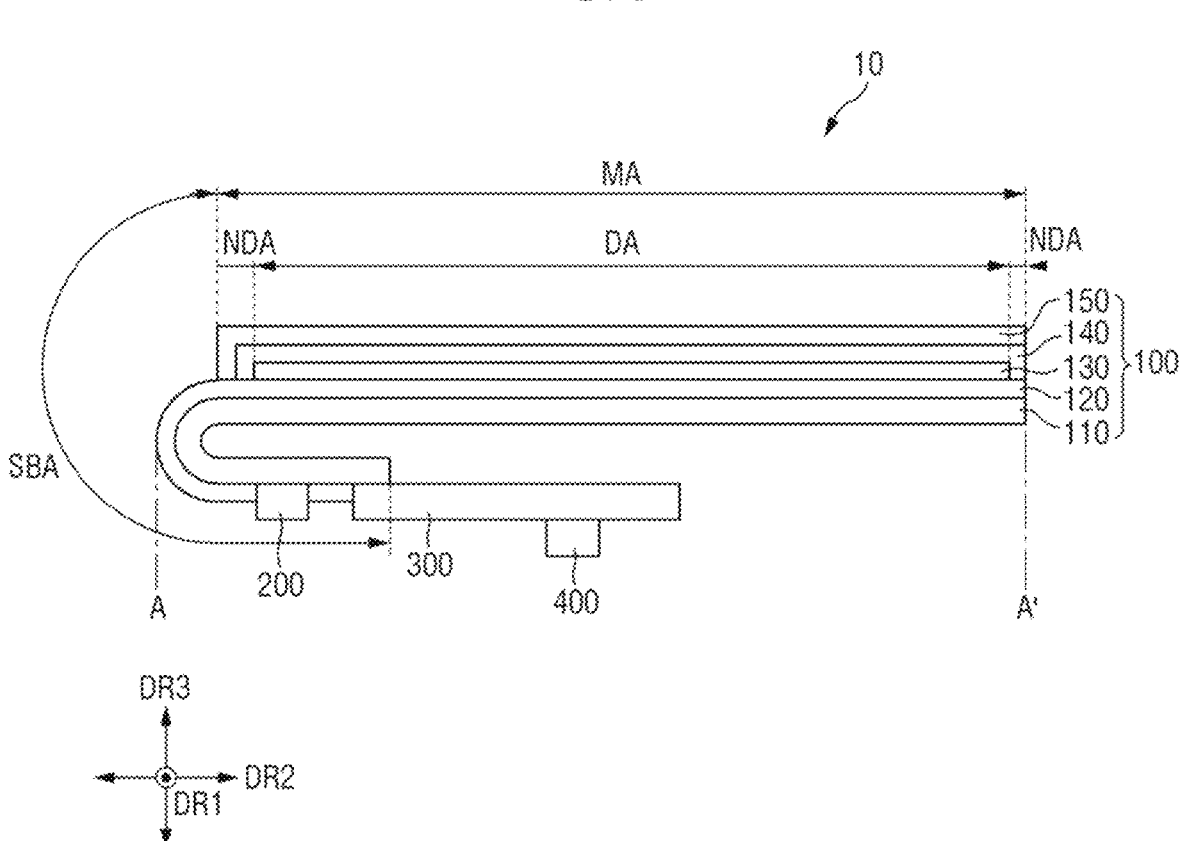
FIG. 3 is a schematic cross-sectional view of an example of a plane cut along line A-A' of FIG. 2.

FIG. 1 is a schematic perspective view of a display device 10 according to an embodiment. FIG. 2 is a schematic plan view of the display device 10 of FIG. 1. FIG. 3 is a schematic cross-sectional view of an example of a plane cut along line A-A' of FIG. 2.

Referring to FIG. 1, the display device 10 is a device for displaying moving images or still images. The display device 10 may be used as a display screen in portable electronic devices such as mobile phones, smartphones, tablet personal computers (PCs), smart watches, watch phones, mobile communication terminals, electronic notebooks, electronic books, portable multimedia players (PMPs), navigation devices and ultra-mobile PCs (UMPCs), as well as in various products such as televisions, notebook computers, monitors, billboards, and Internet of things (IoT) devices.

The display device 10 may be a light emitting display device such as an organic light emitting display device using an organic light emitting diode, a quantum dot light emitting display device including a quantum dot light emitting layer, an inorganic light emitting display device including an inorganic semiconductor, or a micro- or nano-light emitting display device using a micro- or nano-light emitting diode. A case where the display device 10 is an organic light emitting display device will be described below. However, the disclosure is not limited to this case and is also applicable to display devices including an organic insulating material, an organic light emitting material, and a metal material.

The display device 10 may be formed flat, but the disclosure is not limited thereto. For example, the display device 10 may include curved portions formed at left and right ends and having a constant or varying curvature. The display device 10 may be formed to be flexible so that it can be curved, bent, folded, and/or rolled.

The display device 10 may include a display panel 100, a display driving circuit 200, and a circuit board 300.

The display panel 100 may include a display area DA in which multiple emission areas EA (see FIG. 2) for displaying an image are arranged (disposed).

For example, a substrate 110 (see FIG. 3) of the display panel 100 may include a main area MA, which includes the display area DA and a non-display area NDA disposed around the display area DA, and a sub-area SBA which protrudes from a side of the main area MA in a second direction DR2.

The display driving circuit 200 may be provided as an integrated circuit and mounted in the sub-area SBA. The display driving circuit 200 may supply data driving signals corresponding to data lines DL (see FIG. 5) of the display panel 100.

The circuit board 300 may be bonded to signal pads SPD (see FIG. 4) disposed on an edge of the sub-area SBA.

Figure 4:
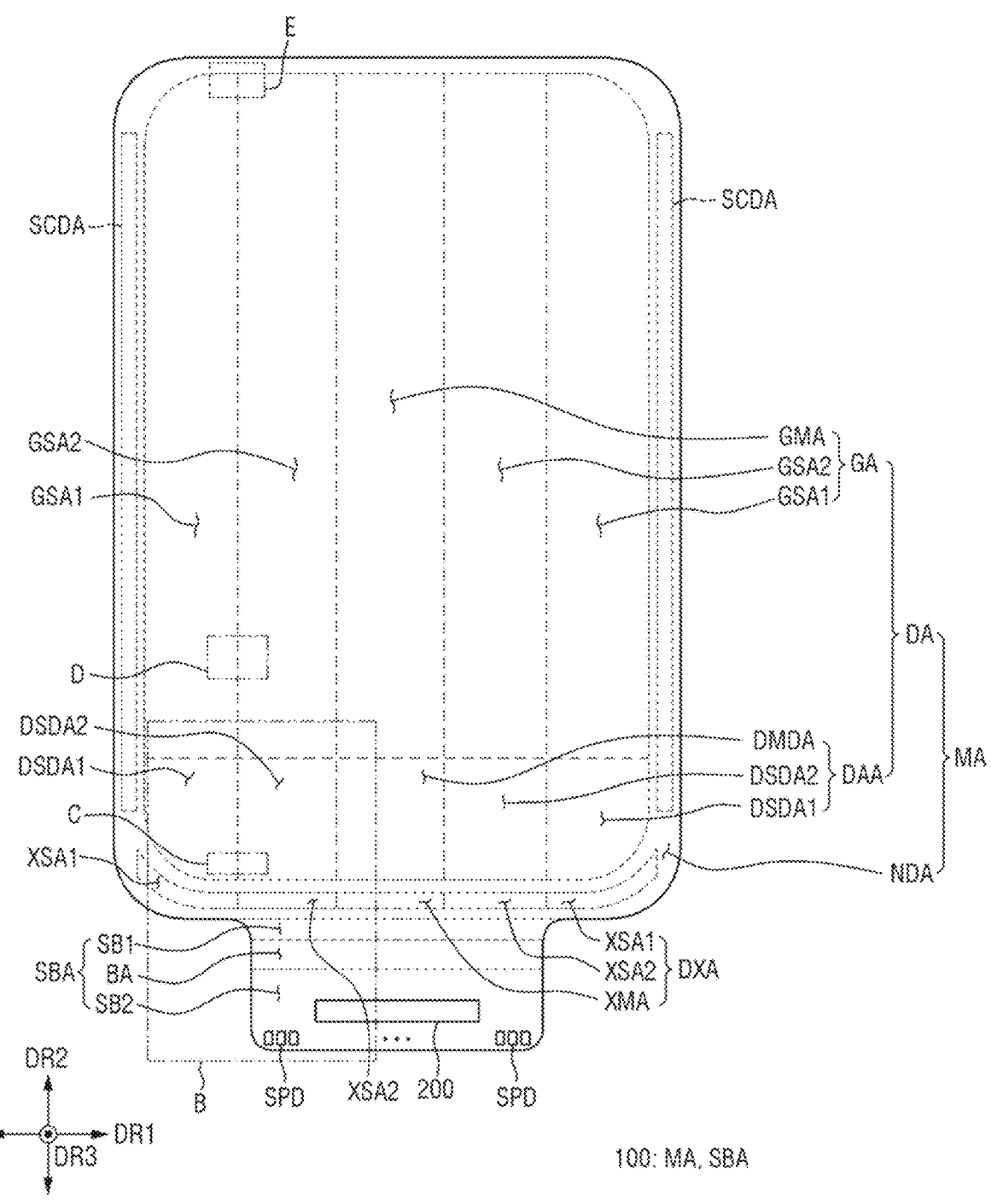
FIG. 4 is a schematic plan view of a main area and a sub-area of the display device of FIG. 1.

In FIGS. 1 and 4, the sub-area SBA is spread out parallel to the main area MA. On the other hand, in FIGS. 2 and 3, a portion of the sub-area SBA is bent.

Referring to FIG. 2, the display area DA may be shaped like a rectangular plane having short sides in a first direction DR1 and long sides in the second direction DR2 intersecting the first direction DR1. Each corner where a short side extending in the first direction DR1 meets a long side extending in the second direction DR2 may be rounded with a predetermined or selected curvature or may be right-angled. The planar shape of the display area DA is not limited to a quadrilateral shape but may also be another polygonal shape, a circular shape, and/or an oval shape.

The display area DA may occupy most of the main area MA. The display area DA may be disposed in a center of the main area MA.

The display area DA may include multiple emission areas EA arranged side by side with each other. The display area DA may further include a non-emission area NEA between the emission areas EA.

The emission areas EA may be arranged side by side with each other in the first direction DR1 and the second direction DR2.

Each of the emission areas EA may have a rhombic planar shape or a rectangular planar shape. However, this is only an example, and the planar shape of each of the emission areas EA according to an embodiment is not limited to that illustrated in FIG. 2. For example, the emission areas EA may also have a polygonal shape other than a quadrilateral shape, a circular shape, or an oval shape in plan view.

The emission areas EA may include first emission areas EA1 emitting light of a first color in a predetermined or selected wavelength band, second emission areas EA2 emitting light of a second color in a wavelength band lower than that of the first color, and third emission areas EA3 emitting light of a third color in a wavelength band lower than that of the second color.

For example, the first color may be red in a wavelength band of approximately 600 to approximately 750 nm. The second color may be green in a wavelength band of approximately 480 to approximately 560 nm. The third color may be blue in a wavelength band of approximately 370 to approximately 460 nm.

As illustrated in FIG. 2, the first emission areas EA1 and the third emission areas EA3 may be alternately disposed in the first direction DR1 or the second direction DR2. The second emission areas EA2 may be arranged side by side with each other in the first direction DR1 or the second direction DR2.

Multiple pixels PX displaying respective luminances and colors may be provided by the emission areas EA. Each of the pixels PX may be a basic unit that displays various colors including white with a predetermined or selected luminance.

For example, each of the pixels PX may be composed of at least one first emission area EA1, at least one second emission area EA2, and at least one third emission area EA3 adjacent to each other.

Each of the pixels PX may display the color and luminance of a mixture of light emitted from at least one first emission area EA1, at least one second emission area EA2, and at least one third emission area EA3 adjacent to each other.

Although the emission areas EA have the same area in FIG. 2, this is only an example. In another example, the third emission area EA3 may have the largest area, and the second emission area EA2 may have the smallest area.

Although the emission areas EA are arranged side by side in the first direction DR1 and the second direction DR2 in FIG. 2, this is only an example. In another example, the second emission areas EA2 may neighbor the first emission areas EA1 and the third emission areas EA3 in diagonal directions intersecting the first direction DR1 and the second direction DR2.

Referring to FIG. 3, the display panel 100 of the display device 10 may include the substrate 110 including the main area MA and the sub-area SBA, a circuit layer 120 disposed on the substrate 110, and a light emitting element layer 130 disposed on the circuit layer 120.

The circuit layer 120 may include pixel drivers PXD (see FIG. 9) respectively corresponding to the emission areas EA and the data lines DL (see FIG. 5) transmitting data signals Vdata (see FIG. 9) to the pixel drivers PXD.

The light emitting element layer 130 may include light emitting elements LEL (see FIG. 13) corresponding to the emission areas EA, respectively. The light emitting elements LEL may be electrically connected to the pixel drivers PXD of the circuit layer 120, respectively.

The display panel 100 of the display device 10 may further include a sealing layer 140 covering the light emitting element layer 130 and a sensor electrode layer 150 disposed on the sealing layer 140.

The substrate 110 may be made of an insulating material such as polymer resin. For example, the substrate 110 may be made of polyimide. The substrate 110 may be a flexible substrate that can be bent, folded, and/or rolled.

In other embodiments, the substrate 100 may be made of an insulating material such as glass.

The sealing layer 140 may be disposed on the circuit layer 120, correspond to the main area MA, and cover the light emitting element layer 130. The sealing layer 140 may include a structure in which two or more inorganic layers and at least one organic layer are alternately stacked on each other.

The sensor electrode layer 150 may be disposed on the sealing layer 140 and may correspond to the main area MA. The sensor electrode layer 150 may include touch electrodes for sensing a touch of a person or an object.

The display device 10 may further include a cover window (not illustrated) disposed on the sensor electrode layer 150. The cover window may be attached onto the sensor electrode layer 150 by a transparent adhesive member such as an optically clear adhesive (OCA) film or an optically clear resin (OCR). The cover window may be an inorganic material such as glass or may be an organic material such as plastic or polymer material. The cover window may protect the sensor electrode layer 150, the sealing layer 140, the light emitting element layer 130, and the circuit layer 120 from electrical and physical impacts on a display surface.

The display device 10 may further include an anti-reflection member (not illustrated) disposed between the sensor electrode layer 150 and the cover window. The anti-reflection member may be a polarizing film or a color filter. The anti-reflection member may block external light that is reflected by the sensor electrode layer 150, the sealing layer 140, the light emitting element layer 130, the circuit layer 120, and interfaces between them, thereby preventing a reduction in visibility of an image of the display device 10.

The display device 10 according to an embodiment may further include a touch driving circuit 400 for driving the sensor electrode layer 150.

The touch driving circuit 400 may be provided as an integrated circuit.

The touch driving circuit 400 may be mounted on the circuit board 300 bonded to the signal pads SPD and thus may be electrically connected to the sensor electrode layer 150.

In other embodiments, like the display driving circuit 200, the touch driving circuit 400 may be mounted on a second sub-area SB2 of the substrate 110.

The touch driving circuit 400 may transmit touch driving signals to multiple driving electrodes included in the sensor electrode layer 150, receive touch sensing signals of multiple touch nodes through multiple sensing electrodes, respectively, and detect amounts of charge change in mutual capacitance based on the touch sensing signals.

For example, the touch driving circuit 400 may determine whether a user's touch or proximity has occurred based on the touch sensing signal of each of the touch nodes. The user's touch may indicate that an object such as the user's finger or a pen directly touches a front surface of the display device 10. The user's proximity may indicate that an object such as the user's finger or a pen hovers above the front surface of the display device 10.

FIG. 4 is a schematic plan view of the main area MA and the sub-area SBA of the display device 10 of FIG. 1.

Referring to FIG. 4, the sub-area SBA may include a bending area BA which may be transformed into a bent shape and a first sub-area SB1 and the second sub-area SB2 which contact both sides of the bending area BA.

The first sub-area SB1 may be disposed between the main area MA and the bending area BA. A side of the first sub-area SB1 may contact the non-display area NDA of the main area MA, and the other side of the first sub-area SB1 may contact the bending area BA.

The second sub-area SB2 may be spaced apart from the main area MA with the bending area BA interposed between them and may be disposed on a lower surface of the substrate 110 by the bending area BA transformed into a bent shape. For example, the second sub-area SB2 may be overlapped by the main area MA in a thickness direction DR3 of the substrate 110 due to the bending area BA transformed into a bent shape.

A side of the second sub-area SB2 may contact the bending area BA.

The signal pads SPD and the display driving circuit 200 may be disposed in the second sub-area SB2.

The display driving circuit 200 may generate signals and voltages for driving the pixel drivers PXD of the display area DA.

The display driving circuit 200 may be provided as an integrated circuit and mounted on the second sub-area SB2 of the substrate 110 by a chip on glass (COG) method, a chip on plastic (COP) method, or an ultrasonic bonding method. However, the disclosure is not limited thereto. For example, the display driving circuit 200 may also be mounted on the circuit board 300 by a chip on film (COF) method.

The circuit board 300 may be attached and electrically connected to the signal pads SPD of the second sub-area SB2 using an anisotropic conductive film or a low-resistance, high-reliability material such as SAP.

The pixel drivers PXD of the display area DA and the display driving circuit 200 may receive digital video data, timing signals, and driving voltages from the circuit board 300.

The circuit board 300 may be a flexible printed circuit board, a printed circuit board, or a flexible film such as a chip on film.

According to an embodiment, the non-display area NDA may include a demultiplexer (demux) area DXA formed in a portion adjacent to the sub-area SBA. The demux area DXA may be disposed adjacent to an edge of the display area DA in the second direction DR2 which is adjacent to the sub-area SBA.

In the demux area DXA, demux circuit units (demux circuits) DMC (see FIG. 5) electrically connected between the data lines DL (see FIG. 5) of the display area DA and the display driving circuit 200 of the sub-area SBA may be disposed.

The demux area DXA may include a demux middle area XMA in the middle in the first direction DR1, a first demux side area XSA1 adjacent to a bent portion of an edge of the substrate 110, and a second demux side area XSA2 disposed between the demux middle area XMA and the first demux side area XSA1.

The demux area DXA may include two second demux side areas XSA2 and two first demux side areas XSA1 disposed on both sides of the demux middle area XMA in the first direction DR1.

The display area DA may include a demux adjacent area DAA adjacent to the demux area DXA.

The demux adjacent area DAA may include a display middle area DMDA adjacent to the demux middle area XMA in the second direction DR2, a first display side area DSDA1 adjacent to the first demux side area XSA1 in the second direction DR2, and a second display side area DSDA2 adjacent to the second demux side area XSA2 in the second direction DR2. In the demux adjacent area DAA, input detour lines IDEL (see FIG. 5) electrically connected to first demux circuit units DMC1 (see FIG. 5) of the first demux side area XSA1 may be disposed.

The display area DA may further include a general area GA disposed between the demux adjacent area DAA and the non-display area NDA in the second direction DR2.

The general area GA may include a general middle area GMA adjacent to the display middle area DMDA in the second direction DR2, a first general side area GSA1 adjacent to the first display side area DSDA1 in the second direction DR2, and a second general side area GSA2 adjacent to the second display side area DSDA2 in the second direction DR2.

The non-display area NDA may further include a scan driving circuit area SCDA disposed adjacent to at least one edge of the display area DA in the first direction DR1.

The circuit layer 120 may include a scan driving circuit (not illustrated) disposed in the scan driving circuit area SCDA. The scan driving circuit may supply scan signals respectively to scan lines extending in the first direction DR1 in the display area DA.

For example, the display driving circuit 200 or the circuit board 300 may supply a scan control signal to the scan driving circuit based on digital video data and timing signals.

The circuit board 300 may supply a predetermined or selected constant voltage for generating a scan signal to the scan driving circuit.

Although the scan driving circuit area SCDA is a portion of the non-display area NDA which is adjacent to both edges of the display area DA in the first direction DR1 in FIG. 4, this is only an example. For example, although not separately illustrated, the scan driving circuit area SCDA may also be a portion of the non-display area NDA which is adjacent to at least one side of the display area DA in the first direction DR1 or may be provided as separate areas which overlap portions of the display area DA.

Figure 5:
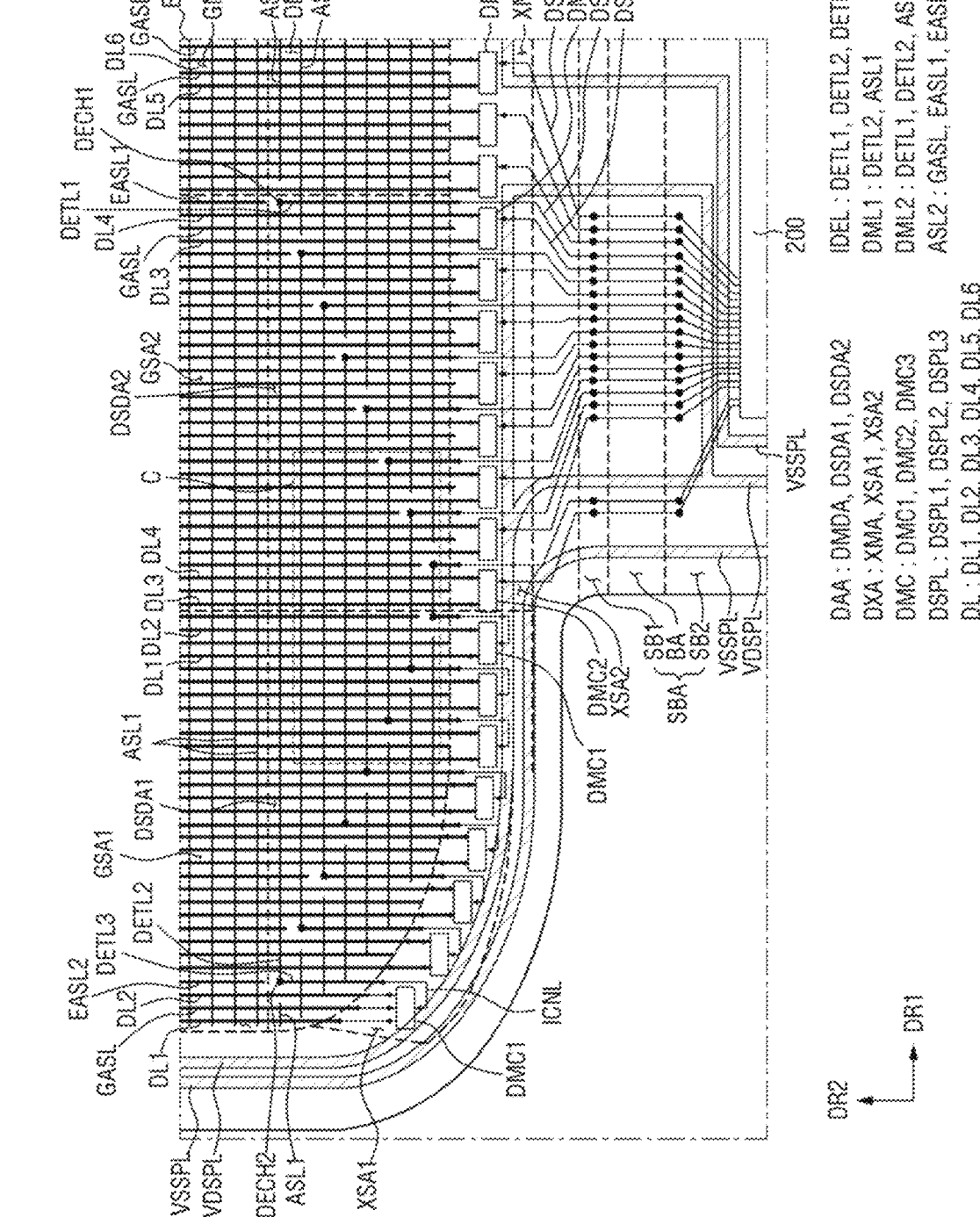
FIG. 5 is a schematic plan view of an example of portion B of FIG. 4.

FIG. 5 is a schematic plan view of an example of portion B of FIG. 4. FIG. 6 is a schematic plan view illustrating an example of the data lines DL, first dummy lines DML1, second dummy lines DML2, and first power auxiliary lines disposed in portion C of FIGS. 4 and 5.

Referring to FIG. 5, the circuit layer 120 of the display device 10 according to an embodiment may include the pixel drivers PXD (see FIG. 9) respectively corresponding to the emission areas EA and respectively electrically connected to the light emitting elements LEL (see FIG. 9) of the light emitting element layer 130, the data lines DL transmitting the data signals Vdata (see FIG. 9) to the pixel drivers PXD, the first dummy lines DML1 disposed in the display area DA and extending in the first direction DR1 intersecting the data lines DL, the second dummy lines DML2 extending in the second direction DR2 parallel to the data lines DL and neighboring the data lines DL, respectively, and the demux circuit units DMC disposed in the demux area DXA of the non-display area NDA, which is adjacent to the sub-area SBA, and electrically connected between the display driving circuit 200 and the data lines DL.

The circuit layer 120 may further include data supply lines DSPL electrically connected to output terminals of the display driving circuit 200, respectively.

The demux circuit units DMC may be arranged in the first direction DR1 in the demux area DXA.

The demux circuit units DMC may include the first demux circuit units DMC1 disposed in the first demux side area XSA1 and second demux circuit units DMC2 disposed in the second demux side area XSA2.

The demux circuit units DMC may further include third demux circuit units DMC3 disposed in the demux middle area XMA.

One (e.g., a first demux circuit unit DMC1) of the demux circuit units DMC may include an input terminal DIP (see FIG. 7) electrically connected to the display driving circuit

200 through one (e.g., DSPL1 in FIGS. 5 and 7) of the data supply lines DSPL and a first output terminal AOP (see FIG. 7) and a second output terminal BOP (see FIG. 7) electrically connected to two (e.g., DL1 and DL2 in FIGS. 5 and 7) of the data lines DL, respectively.

The data lines DL may include first data lines DL1 and second data lines DL2 disposed in the first display side area DSDA1 and the first general side area GSA1 and third data lines DL3 and fourth data lines DLA disposed in the second display side area DSDA2 and the second general side area GSA2.

The data lines DL may further include fifth data lines DL5 and sixth data lines DL6 disposed in the display middle area DMDA and the general middle area GMA.

The first data lines DL1 and the second data lines DL2 disposed in the first display side area DSDA1 and the first general side area GSA1 may be respectively electrically connected to the first output terminals AOP and the second output terminals BOP of the first demux circuit units DMC1 disposed in the first demux side area XSA1.

The third data lines DL3 and the fourth data lines DL4 disposed in the second display side area DSDA2 and the second general side area GSA2 may be respectively electrically connected to first output terminals and second output terminals of the second demux circuit units DMC2 disposed in the second demux side area XSA2.

The fifth data lines DL5 and the sixth data lines DL6 disposed in the display middle area DMDA and the general middle area GMA may be respectively electrically connected to first output terminals and second output terminals of the third demux circuit units DMC3 disposed in the demux middle area XMA.

The data supply lines DSPL may include first data supply lines DSPL1 transmitting data driving signals corresponding to data signals of the first data lines DL1 and the second data lines DL2 disposed in the first display side area DSDA1, second data supply lines DSPL2 transmitting data driving signals corresponding to data signals of the third data lines DL3 and the fourth data lines DL4 disposed in the second display side area DSDA2, and third data supply lines DSPL3 transmitting data driving signals corresponding to data signals of the fifth data lines DL5 and the sixth data lines DL6 disposed in the display middle area DMDA.

The first data supply lines DSPL1 among the data supply lines DSPL may extend from the sub-area SBA to the second demux side area XSA2 and may be electrically connected to the input terminals of the first demux circuit units DMC1 through the input detour lines IDEL disposed in the display area DA.

The second data supply lines DSPL2 among the data supply lines DSPL may extend from the sub-area SBA to the second demux side area XSA2 and may be connected to input terminals of the second demux circuit units DMC2.

The third data supply lines DSPL3 among the data supply lines DSPL may extend from the sub-area SBA to the demux middle area XMA and may be connected to input terminals of the third demux circuit units DMC3.

The input detour lines IDEL may include first detour lines DETL1 disposed in the second display side area DSDA2, extending in the second direction DR2 and electrically connected to the first data supply lines DSPL1, second detour lines DETL2 extending in the first direction DR1 in the second display side area DSDA2 and the first display side area DSDA1 and electrically connected to the first detour lines DETL1, and third detour lines DETL3 disposed in the first display side area DSDA1, extending in the second direction DR2 toward the first demux side area XSA1 and electrically connected to the second detour lines DETL2.

The circuit layer 120 may further include input connection lines ICNL disposed in the first demux side area XSA1 and electrically connecting the third detour lines DETL3 of the input detour lines IDEL and the input terminals of the first demux circuit units DMC1.

The first detour lines DETL1 may extend in the second direction DR2 between the first data supply lines DSPL1 of the second demux side area XSA2 and the second detour lines DETL2.

The second detour lines DETL2 may extend in the first direction DR1 between the first detour lines DETL1 and the third detour lines DETL3.

The third detour lines DETL3 may extend in the second direction DR2 between the first demux side area XSA1 and the second detour lines DETL2. The third detour lines DETL3 may be electrically connected to the input connection lines ICNL of the first demux side area XSA1.

Referring to FIG. 6, the second detour lines DETL2 may be electrically connected to the first detour lines DETL1 through first detour connection holes DECH1 and may be electrically connected to the third detour lines DETL3 through second detour connection holes DECH2.

The first dummy lines DML1 may include the second detour lines DETL2 of the input detour lines IDEL.

The first dummy lines DML1 may further include first auxiliary lines ASL1 to which second power ELVSS (see FIG. 9) is applied, in addition to the second detour lines DETL2.

The second dummy lines DML2 may include the first detour lines DETL1 and the third detour lines DETL3 of the input detour lines IDEL.

The second dummy lines DML2 may further include second auxiliary lines ASL2 to which the second power ELVSS is applied, in addition to the first detour lines DETL1 and the third detour lines DETL3.

As illustrated in FIG. 5, the circuit layer 120 of the display device 10 according to the embodiment may further include a first power supply line VDSPL and a second power supply line VSSPL disposed in the sub-area SBA and the non-display area NDA and respectively transmitting first power ELVDD (see FIG. 9) and the second power ELVSS for driving the light emitting elements LEL.

The first auxiliary lines ASL1 of the first dummy lines DML1 and the second auxiliary lines ASL2 of the second dummy lines DML2 may be electrically connected to the second power supply line VSSPL.

In other words, the first dummy lines DML1 may include the second detour lines DETL2 of the input detour lines IDEL and the first auxiliary lines ASL1 which are portions other than the second detour lines DETL2 and electrically connected to the second power supply line VSSPL.

The second dummy lines DML2 may include the first detour lines DETL1 and the third detour lines DETL3 of the input detour lines IDEL and the second auxiliary lines ASL2 which are portions other than the first detour lines DETL1 and the third detour lines DETL3 and electrically connected to the second power supply line VSSPL.

As illustrated in FIGS. 5 and 6, the second auxiliary lines ASL2 may include general auxiliary lines GASL extending between both ends of the display area DA in the second direction DR2, first extension auxiliary lines EASL1 spaced apart from ends of the first detour lines DETL1 in the second direction DR2 and extending to the second general side area GSA2, and second extension auxiliary lines EASL2 spaced apart from ends of the third detour lines DETL3 in the second direction DR2 and extending to the first general side area GSA1.

Each of the first data lines DL1 among the first data lines DL1 and the second data lines DL2 electrically connected to the first demux circuit units DMC1 and disposed in the first display side area DSDA1 may neighbor one general auxiliary line GASL on one side (e.g., a right side in FIG. 6) in the first direction DR1, and each of the second data lines DL2 may neighbor a third detour line DETL3 and a second extension auxiliary line EASL2 on the one side in the first direction DR1. Here, some pixel drivers PXD electrically connected to the first data line DL1 may be disposed between the general auxiliary line GASL and the first data line DL1 neighboring each other. Some other pixel drivers PXD electrically connected to the second data line DL2 may be disposed between the third detour line DETL3 and the second extension auxiliary line EASL2 and the second data line DL2 neighboring each other.

In other words, each of the first data lines DL1 may face a general auxiliary line GASL with some pixel drivers PXD connected to the first data line DL1 interposed between them. Each of the second data lines DL2 may face a third detour line DETL3 and a second extension auxiliary line EASL2 with some other pixel drivers PXD connected to the second data line DL2 interposed between them.

Each of the third data lines DL3 among the third data lines DL3 and the fourth data lines DL4 electrically connected to the second demux circuit units DMC2 and disposed in the second display side area DSDA2 may neighbor another general auxiliary line GASL, and each of the fourth data lines DL4 may neighbor a first detour line DETL1 and a first extension auxiliary line EASL1.

Each of the fifth data lines DL5 and the sixth data lines DL6 electrically connected to the third demux circuit units DMC3 and disposed in the display middle area DMDA may neighbor a general auxiliary line GASL.

The circuit layer 120 of the display device 10 according to an embodiment may include via holes VIAH for electrical connection between the first dummy lines DML1 and the second dummy lines DML2.

According to an embodiment, some via holes (a subset of via holes) among the via holes VIAH may overlap one of the emission areas EA, and the other via holes (another subset of via holes) may be disposed in the non-emission area NEA between the emission areas EA. This will be described later with reference to FIGS. 14 through 17.

The via holes VIAH may include the first detour connection holes DECH1 for electrical connection between the first detour lines DETL1 and the second detour lines DETL2, the second detour connection holes DECH2 for electrical connection between the second detour lines DETL2 and the third detour lines DETL3, and auxiliary connection holes ASCH (see FIG. 16) for electrical connection between the first auxiliary lines ASL1 and the second auxiliary lines ASL2.

According to an embodiment, the first detour connection holes DECH1 disposed in the second display side area DSDA2 and respectively overlapping the second detour lines DETL2 adjacent thereto in the second direction DR2 may be arranged in a first diagonal direction DD1 intersecting the first direction DR1 and the second direction DR2.

The second detour connection holes DECH2 disposed in the first display side area DSDA1 and respectively overlapping the second detour lines DETL2 adjacent thereto in the second direction DR2 may be arranged in a second diagonal direction DD2 symmetrical to the first diagonal direction DD1.

According to an embodiment, the auxiliary connection holes ASCH (see FIG. 16) may be disposed in the general area GA and the display middle area DMDA.

For example, in the first general side area GSA1 contacting the first display side area DSDA1 in the second direction DR2, the auxiliary connection holes ASCH may be arranged in the second diagonal direction DD2 parallel to the arrangement direction of the second detour connection holes DECH2 of the first display side area DSDA1 or may be arranged in a third diagonal direction DD3 (see FIG. 16) having a steeper slope than the second diagonal direction DD2.

In the second general side area GSA2 contacting the second display side area DSDA2 in the second direction DR2, the auxiliary connection holes ASCH may be arranged in the first diagonal direction DD1 parallel to the arrangement direction of the first detour connection holes DECH1 of the second display side area DSDA2 or may be arranged in a fourth diagonal direction DD4 having a steeper slope than the first diagonal direction DD1.

In this case, it is possible to readily infer whether the first detour connection holes DECH1, the second detour connection holes DECH2, and the auxiliary connection holes ASCH are normally arranged through the arrangement direction of the first detour connection holes DECH1, the arrangement direction of the second detour connection holes DECH2, and the arrangement direction of the auxiliary connection holes ASCH.

Figure 7:
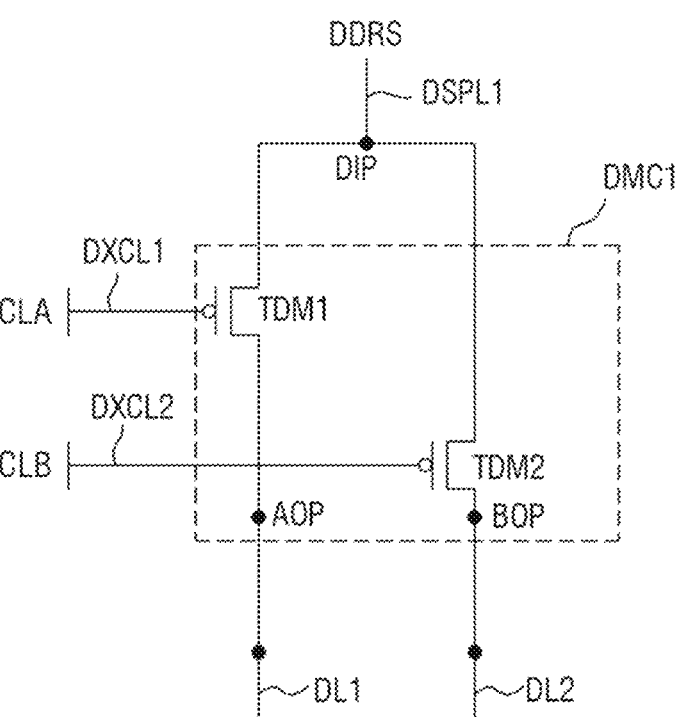
FIG. 7 is a schematic diagram of an equivalent circuit of an example of a first demultiplexer (demux) circuit unit of FIG. 5.
Figure 8:
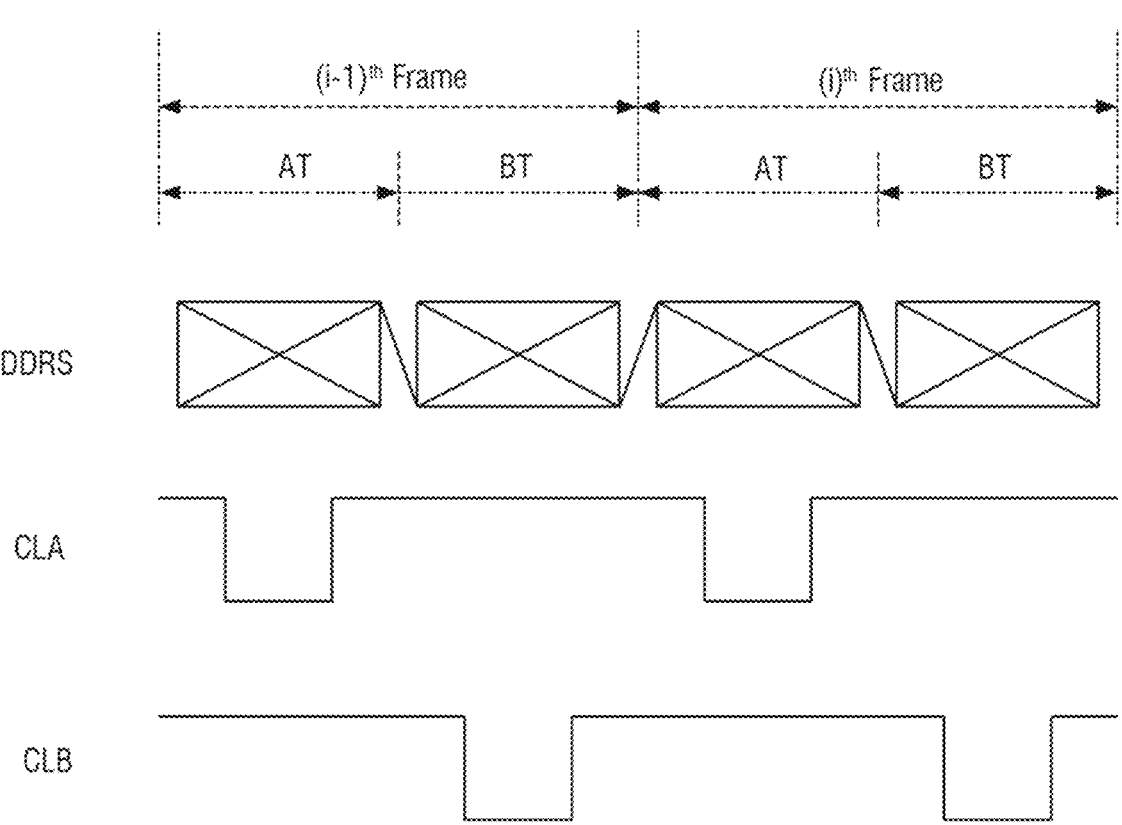
FIG. 8 is a schematic timing diagram showing a data driving signal and demux control signals of FIG. 7.

FIG. 7 is a schematic diagram of an equivalent circuit of an example of a first demux circuit unit DMC1 of FIG. 5. FIG. 8 is a schematic timing diagram showing a data driving signal DDRS and demux control signals CLA and CLB of FIG. 7.

Referring to FIG. 7, one of the first demux circuit units DMC1 among the demux circuit units DMC may include an input terminal DIP which is electrically connected to the display driving circuit 200 and to which one data driving signal DDRS is input, a first output terminal AOP which outputs a higher-priority data signal corresponding to the data driving signal DDRS during a higher-priority output period AT (see FIG. 8), and a second output terminal BOP which outputs a lower-priority data signal corresponding to the data driving signal DDRS during a lower-priority output period BT (see FIG. 8) after the higher-priority data signal AT.

The first demux circuit unit DMC1 may further include a first demux transistor TDM1 electrically connected between the input terminal DIP and the first output terminal AOP and a second demux transistor TDM2 electrically connected between the input terminal DIP and the second output terminal BOP.

The circuit layer 120 of the display device 10 according to an embodiment may further include a first output connection line electrically connecting the first output terminal AOP of each first demux circuit unit DMC1 and a first data line DL1 and a second output connection line electrically connecting the second output terminal BOP of each first demux circuit unit DMC1 and a second data line DL2.

The circuit layer 120 may further include a first demux control line DXCL1 electrically connected to a gate electrode of the first demux transistor TDM1 and a second demux control line DXCL2 electrically connected to a gate electrode of the second demux transistor TDM2.

Referring to FIG. 8, each image frame (an (i-1)th frame, an (i)th frame) may include the higher-priority output period AT and the lower-priority output period BT.

A first demux control signal CLA of the first demux control line DXCL1 may be output at a turn-on level during the higher-priority data signal AT, and a second demux control signal CLB of the second demux control line DXCL2 may be output at a turn-on level during the lower-priority data signal BT.

In this case, during the higher-priority data signal AT, the first demux transistor TDM1 may be turned on to allow the data driving signal DDRS to be output as a data signal of a first data line DL1 through the first output terminal AOP. During the lower-priority data signal BT, the second demux transistor TDM2 may be turned on to allow the data driving signal DDRS to be output as a data signal of a second data line DL2 through the second output terminal BOP.

For example, the data driving signal DDRS may be time-divided into the higher-priority data signal AT and the lower-priority data signal BT by a demux circuit unit DMC.

The equivalent circuit and timing diagrams of each of a second demux circuit unit DMC2 and a third demux circuit unit DMC3 may be substantially the same as the equivalent circuit and timing diagrams of the first demux circuit unit DMC1 illustrated in FIGS. 7 and 8 except that a first output terminal AOP and a second output terminal BOP in the second demux circuit unit DMC2 are electrically connected to a third data line DL3 and a fourth data line DL4, respectively, and a first output terminal AOP and a second output terminal BOP in the third demux circuit unit DMC3 are electrically connected to a fifth data line DL5 and a sixth data line DL6, respectively. Therefore, redundant description of the equivalent circuit and timing diagrams of each of the second demux circuit unit DMC2 and the third demux circuit unit DMC3 will be omitted.

Figure 9:
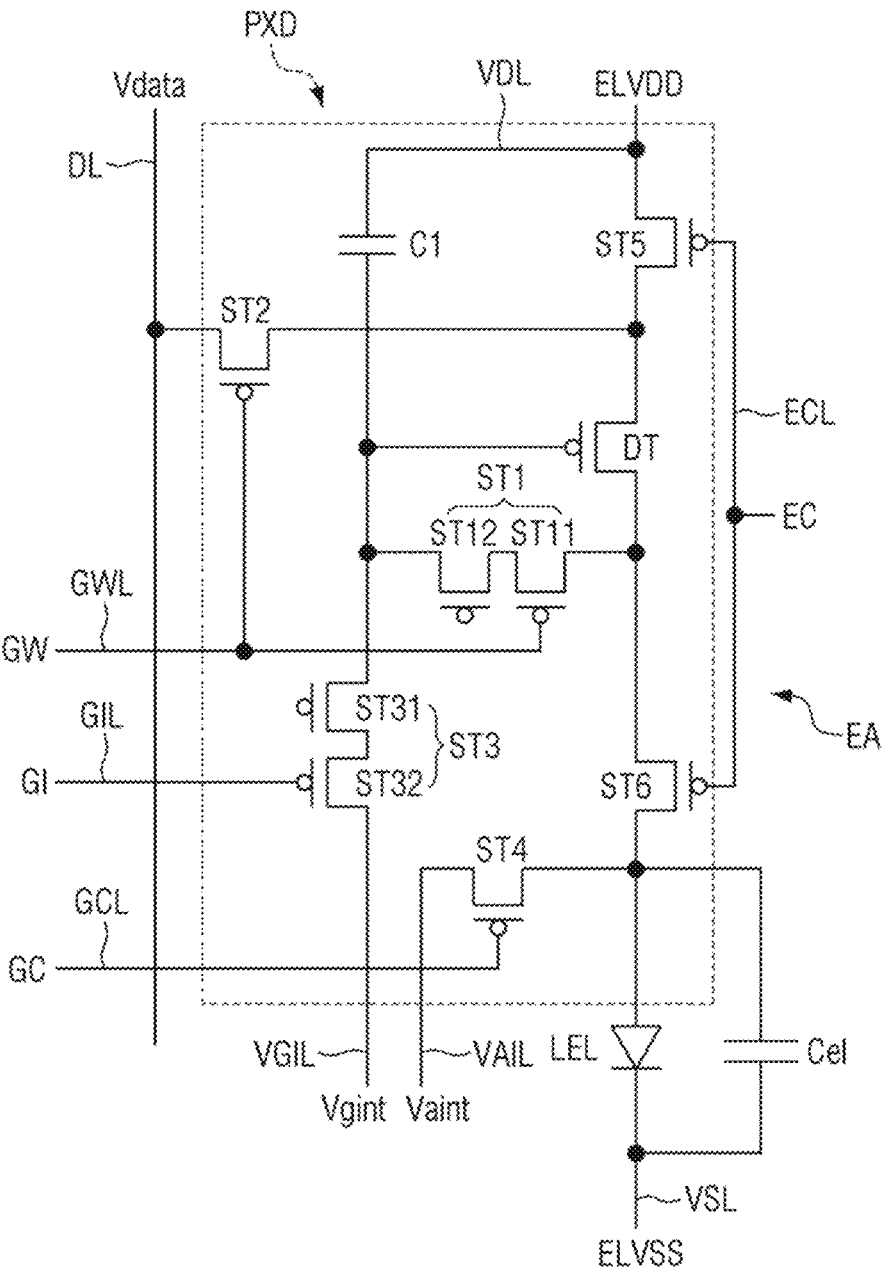
FIG. 9 is a schematic diagram of an equivalent circuit of an example of a pixel driver of the circuit layer.

FIG. 9 is a schematic diagram of an equivalent circuit of an example of a pixel driver PXD of the circuit layer 120.

The circuit layer 120 may include the pixel drivers PXD respectively corresponding to the emission areas EA and electrically connected to the light emitting elements LEL of the light emitting element layer 130, respectively.

Referring to FIG. 9, one of the pixel drivers PXD of the circuit layer 120 may include a driving transistor DT, one or more switch elements ST1 through ST6, and a capacitor C1. The switch elements ST1 through ST6 may include a first transistor ST1 (switch transistor), a second transistor ST2, a third transistor ST3, a fourth transistor ST4, a fifth transistor ST5, and a sixth transistor ST6.

The circuit layer 120 may further include a scan write line GWL transmitting a scan write signal GW to the pixel drivers PXD, a gate control line GCL transmitting a gate control signal GC to the pixel drivers PXD, a scan initialization line GIL transmitting a scan initialization signal GI to the pixel drivers PXD, an emission control line ECL transmitting an emission control signal EC to the pixel drivers PXD, a gate initialization voltage line VGIL transmitting a first initialization voltage Vgint to the pixel drivers PXD, an anode initialization voltage line VAIL transmitting a second initialization voltage Vaint to the pixel drivers PXD, and a first power line VDL transmitting the first power ELVDD to the pixel drivers PXD.

The scan write line GWL may be electrically connected to a gate electrode of each of the first transistor ST1 and the second transistor ST2. The scan initialization line GIL may be electrically connected to a gate electrode of the third transistor ST3. The gate control line GCL may be electrically connected to a gate electrode of the fourth transistor ST4. The emission control line ECL may be electrically connected to a gate electrode of each of the fifth transistor ST5 and the sixth transistor ST6.

The driving transistor DT may be connected in series to a light emitting element LEL between the first power line VDL and a second power line VSL.

A first electrode of the driving transistor DT may be connected to the first power line VDL through the fifth transistor ST5.

The first electrode of the driving transistor DT may be connected to a data line DL through the second transistor ST2.

A second electrode of the driving transistor DT may be connected to the light emitting element LEL through the sixth transistor ST6.

The capacitor C1 may be connected between the first power line VDL and a gate electrode of the driving transistor DT. For example, the gate electrode of the driving transistor DT may be connected to the first power line VDL through the capacitor C1.

Therefore, in case that a data signal of the data line DL is transmitted to the first electrode of the driving transistor DT, the driving transistor DT may generate a drain-source current corresponding to the data signal. The drain-source current of the driving transistor DT may be supplied to the light emitting element LEL as a driving current.

The light emitting element LEL may emit light having a luminance corresponding to the driving current generated by the driving transistor DT.

The light emitting element LEL may include an anode AND (see FIG. 13) and a cathode CTD (see FIG. 13) facing each other and a light emitting layer EML (see FIG. 13) between the anode AND and the cathode CTD.

For example, the light emitting element LEL may be an organic light emitting diode having a light emitting layer made of an organic light emitting material. In other embodiments, the light emitting element LEL may be an inorganic light emitting element having a light emitting layer made of an inorganic semiconductor. In other embodiments, the light emitting element LEL may be a quantum dot light emitting element having a quantum dot light emitting layer. In other embodiments, the light emitting element LEL may be a micro-light emitting diode.

A capacitor Cel connected in parallel to the light emitting element LEL may be a parasitic capacitance between the anode and the cathode.

The first transistor ST1 may be connected between the gate electrode of the driving transistor DT and the second electrode of the driving transistor DT.

The first transistor ST1 may include multiple sub-transistors connected in series. For example, the first transistor ST1 may include a first sub-transistor ST11 and a second sub-transistor ST12.

A first electrode of the first sub-transistor ST11 may be connected to the second electrode of the driving transistor DT, a second electrode of the first sub-transistor ST11 may be connected to a first electrode of the second sub-transistor ST12, and a second electrode of the second sub-transistor ST12 may be connected to the gate electrode of the driving transistor DT.

In this case, it is possible to prevent the electric potential of the gate electrode of the driving transistor DT from being changed by a leakage current caused by the first transistor ST1 in a turned-off state.

The second transistor ST2 is connected between the first electrode of the driving transistor DT and the data line DL.

The gate electrode of each of the first transistor ST1 and the second transistor ST2 is connected to the scan write line GWL.

In case that the scan write signal GW is supplied through the scan write line GWL, the first transistor ST1 and the second transistor ST2 are turned on, and the gate electrode and the second electrode of the driving transistor DT become the same potential through the turned-on first transistor ST1. The data signal of the data line DL may be supplied to the first electrode of the driving transistor DT through the turned-on second transistor ST2.

Here, in case that a voltage difference between the first electrode and the gate electrode of the driving transistor DT is greater than a threshold voltage, the driving transistor DT may be turned on, and thus the drain-source current may be generated between the first electrode and the second electrode of the driving transistor DT.

The third transistor ST3 is connected between the gate electrode of the driving transistor DT and the gate initialization voltage line VGIL. The gate electrode of the third transistor ST3 may be connected to the scan initialization line GIL.

The third transistor ST3 may include multiple sub-transistors connected in series. For example, the third transistor ST3 may include a third sub-transistor ST31 and a fourth sub-transistor ST32.

A first electrode of the third sub-transistor ST31 may be connected to the gate electrode of the driving transistor DT, a second electrode of the third sub-transistor ST31 may be connected to a first electrode of the fourth sub-transistor ST32, and a second electrode of the fourth sub-transistor ST32 may be connected to the gate initialization voltage line VGIL.

In this case, it is possible to prevent the electric potential of the gate electrode of the driving transistor DT from being changed by a leakage current caused by the third transistor ST3 in a turned-off state.

In case that the scan initialization signal GI is supplied through the scan initialization line GIL, the third transistor ST3 may be turned on. At this time, the gate electrode of the driving transistor DT may be connected to the gate initialization voltage line VGIL through the turned-on third transistor ST3. Accordingly, the electric potential of the gate electrode of the driving transistor DT may be initialized to the first initialization voltage Vgint of the gate initialization voltage line VGIL.

The fourth transistor ST4 may be connected between the anode of the light emitting element LEL and the anode initialization voltage line VAIL. The gate electrode of the fourth transistor ST4 may be connected to the gate control line GCL.

In case that the gate control signal GC is supplied through the gate control line GCL, the fourth transistor ST4 may be turned on. At this time, the anode of the light emitting element LEL may be connected to the anode initialization voltage line VAIL through the turned-on fourth transistor ST4. Accordingly, the electric potential of the anode of the light emitting element LEL may be initialized to the second initialization voltage Vaint of the anode initialization voltage line VAIL.

The fifth transistor ST5 may be connected between the first electrode of the driving transistor DT and the first power line VDL.

The sixth transistor ST6 may be connected between the second electrode of the driving transistor DT and the anode of the light emitting element LEL.

A gate electrode of each of the fifth transistor ST5 and the sixth transistor ST6 may be connected to the emission control line ECL.

In case that the emission control signal EC is supplied through the emission control line ECL, the driving transistor DT and the light emitting element LEL may be connected in series between the first power line VDL and the second power line VSL. Accordingly, the driving current of the driving transistor DT may be supplied to the light emitting element LEL, and the light emitting element LEL may emit light based on the driving current.

As illustrated in FIG. 9, the driving transistor DT and the switch elements ST1 through ST6 included in the pixel driver PXD may all be provided as P-type metal-oxide-semiconductor field-effect transistors (MOSFETs).

In other embodiments, some of the driving transistor DT and the switch elements ST1 through ST6 included in the pixel driver PXD may be provided as P-type MOSFETs, and the others may be provided as N-type MOSFETs. In this case, switch elements provided as P-type MOSFETs and switch elements provided as N-type MOSFETs may include active layers of different semiconductor materials. Therefore, a width of the pixel driver PXD can be reduced through a stacked structure, which may be advantageous in improving resolution.

Figure 10:
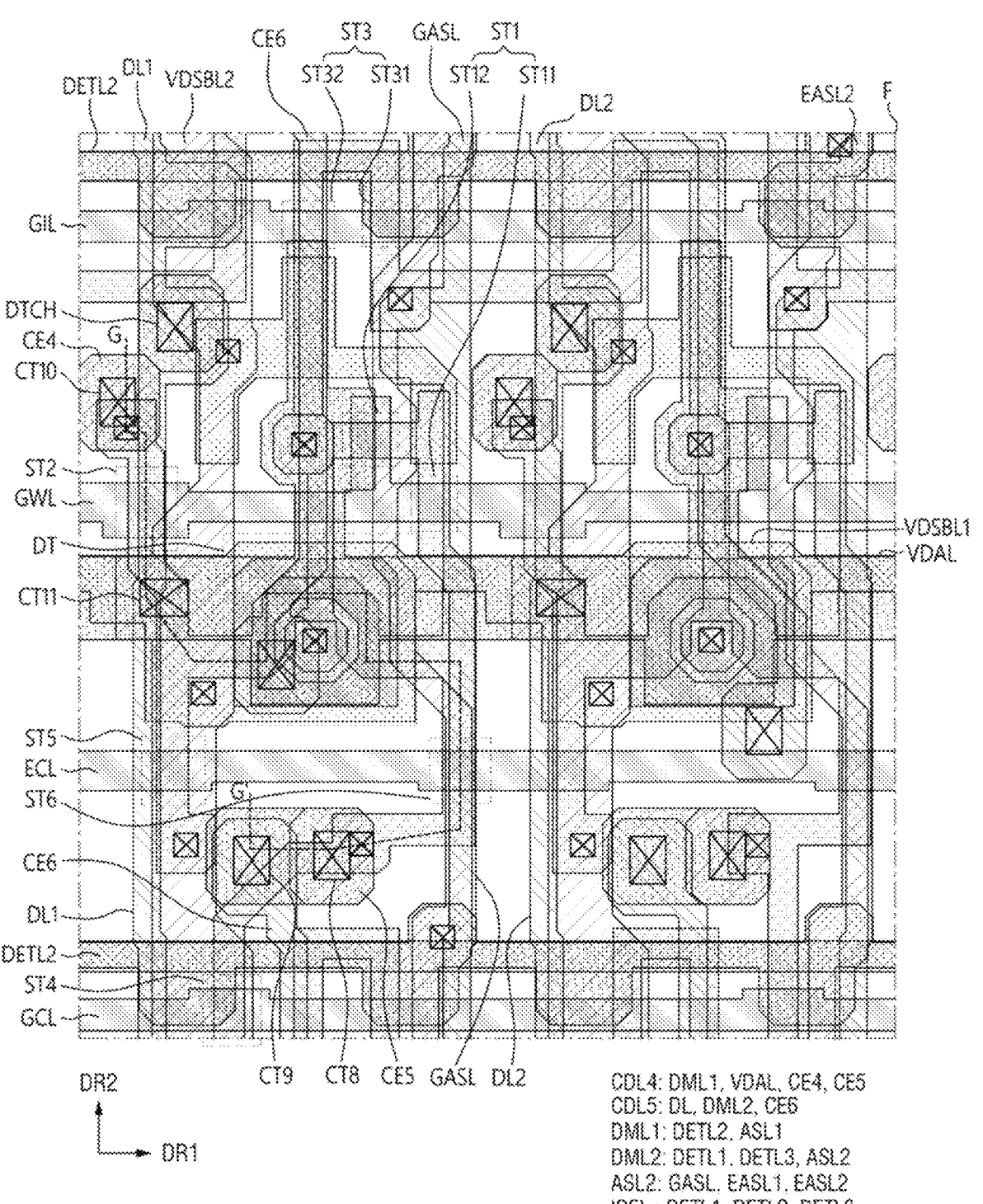
FIG. 10 is a schematic plan view of two pixel drivers disposed in portion F of FIG. 6.
Figure 11:
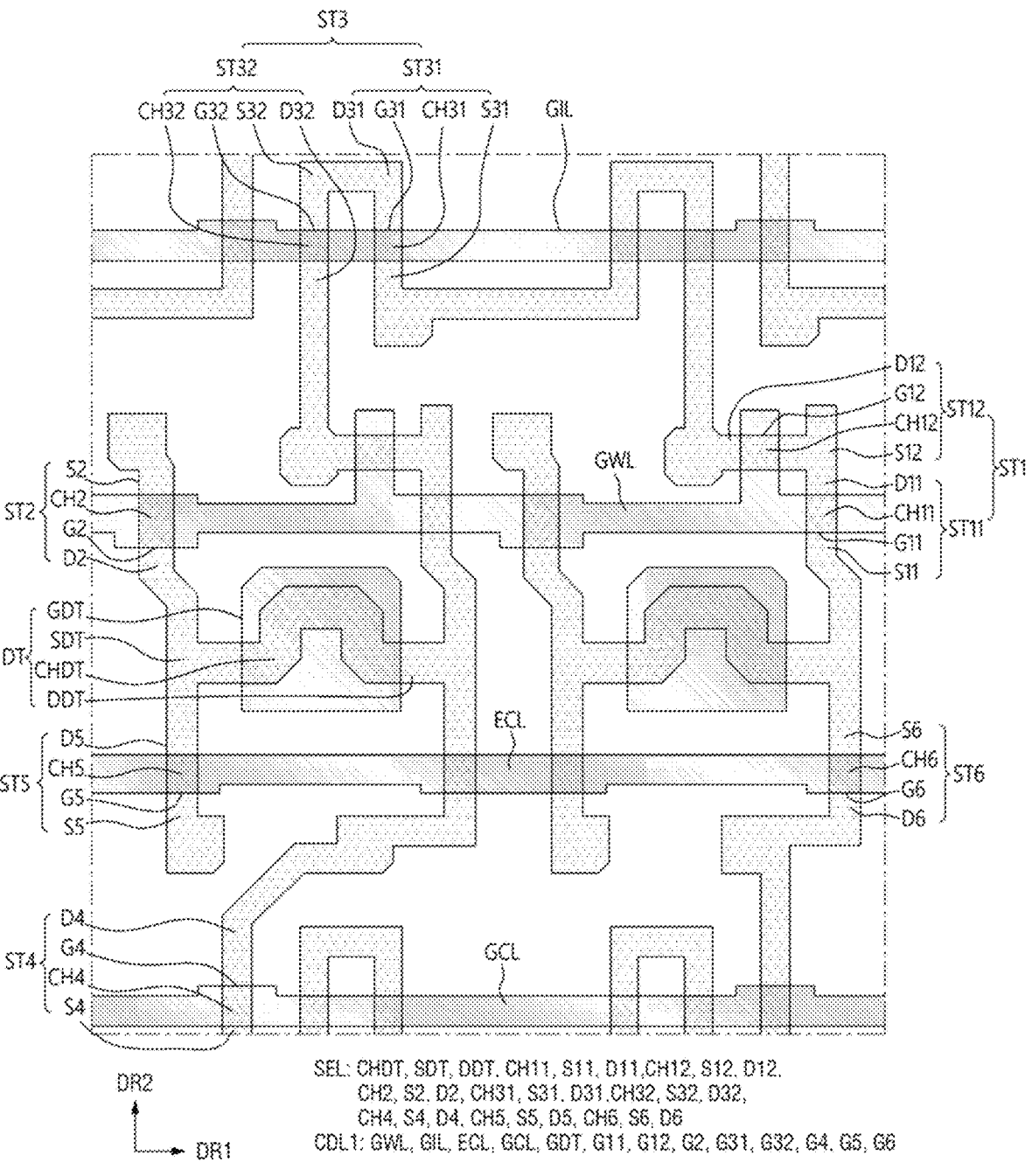
FIG. 11 is a schematic plan view of a semiconductor layer and a first conductive layer of FIG. 10.
Figure 12:
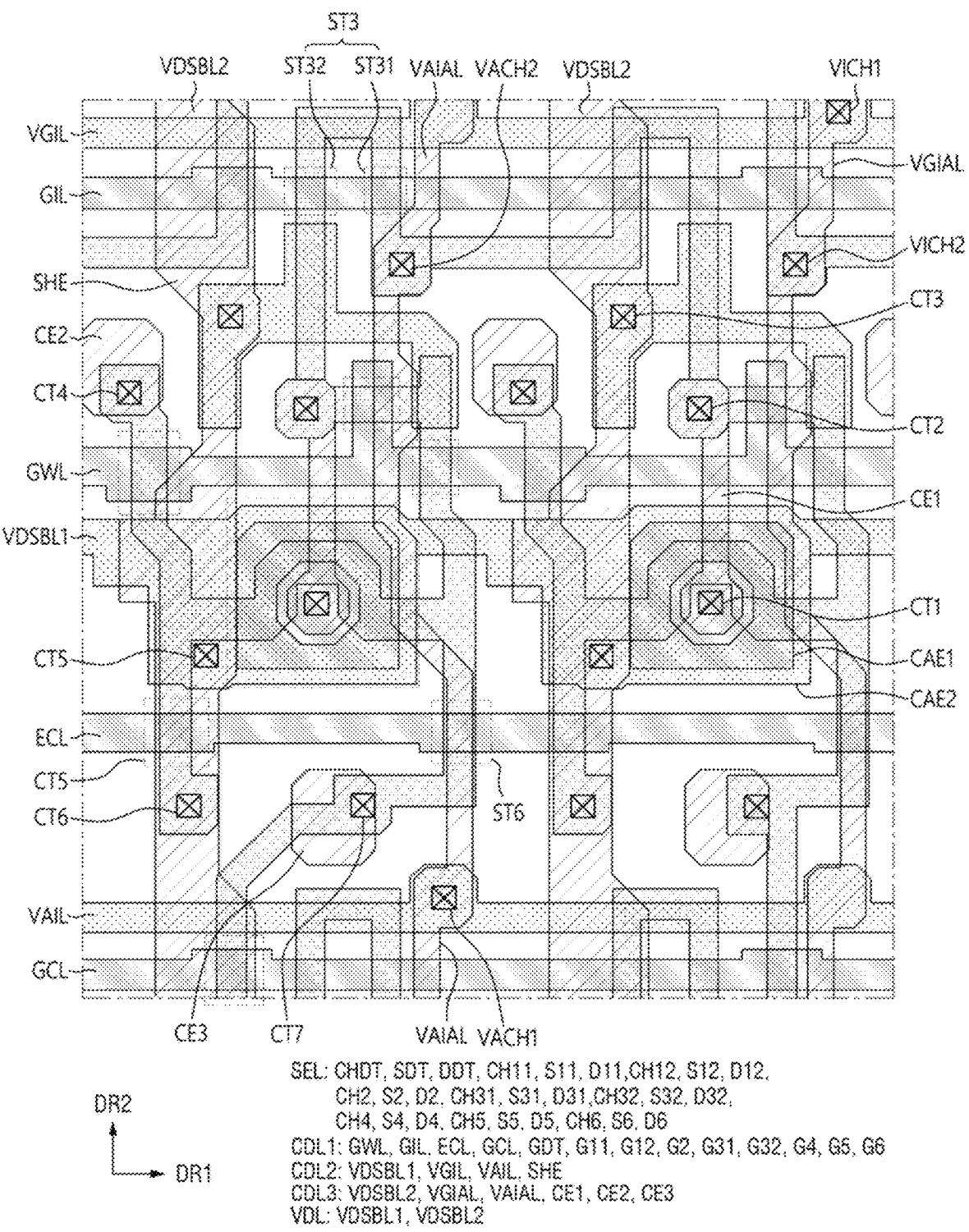
FIG. 12 is a schematic plan view of the semiconductor layer, the first conductive layer, a second conductive layer, and a third conductive layer of FIG. 10.
Figure 13:
FIG. 13 is a schematic cross-sectional view of an example of a plane cut along line G-G' of FIG. 10.

FIG. 10 is a schematic plan view of two pixel drivers PXD disposed in portion F of FIG. 6. FIG. 11 is a schematic plan view of a semiconductor layer SEL and a first conductive layer CDL1 of FIG. 10. FIG. 12 is a schematic plan view of the semiconductor layer SEL, the first conductive layer CDL1, a second conductive layer CDL2, and a third conductive layer CDL3 of FIG. 10. FIG. 13 is a schematic cross-sectional view of an example of a plane cut along line G-G' of FIG. 10.

First, as illustrated in FIG. 13, the circuit layer 120 may include the semiconductor layer SEL on the substrate 110, the first conductive layer CDL1 on a first gate insulating layer 122 covering the semiconductor layer SEL, the second conductive layer CDL2 on a second gate insulating layer 123 covering the first conductive layer CDL1, the third conductive layer CDL3 on an interlayer insulating layer 124 covering the second conductive layer CDL2, a fourth conductive layer CDL4 on a first planarization layer 125 covering the third conductive layer CDL3, a fifth conductive layer CDL5 on a second planarization layer 126 covering the fourth conductive layer CDL4, and a third planarization layer 127 covering the fifth conductive layer CDL5.

The light emitting element layer 130 may be disposed on the third planarization layer 127.

Referring to FIG. 11, the semiconductor layer SEL may include channel portions CHDT, CH11, CH12, CH2, CH31, CH32, CH4, CH5 and CH6, source electrodes SDT, S11, S12, S2, S31, S32, S4, S5 and S6 and drain electrodes DDT, D11, D12, D2, D31, D32, D4, D5 and D6 of a driving transistor DT and first through sixth transistors ST1 through ST6 included in each pixel driver PXD.

The first conductive layer CDL1 may include gate electrodes GDT, G11, G12, G2, G31, G32, G4, G5 and G6 of the driving transistor DT and the first through sixth transistors ST1 through ST6.

The first conductive layer CDL1 may further include scan lines, that is, a scan write line GWL, a scan initialization line GIL, an emission control line ECL, and a gate control line GCL connected to the gate electrodes GDT, G11, G12, G2, G31, G32, G4, G5 and G6 of the driving transistor DT and the first through sixth transistors ST1 through ST6. The scan write line GWL, the scan initialization line GIL, the emission control line ECL, and the gate control line GCL may extend in the first direction DR1.

Referring to FIG. 12, the second conductive layer CDL2 may include a gate initialization voltage line VGIL connected to the drain electrode D32 of the third transistor ST3 and transmitting a first initialization voltage Vgint and an anode initialization voltage line VAIL connected to the drain electrode D4 of the fourth transistor ST4 and transmitting a second initialization voltage Vaint. The gate initialization voltage line VGIL and the anode initialization voltage line VAIL may extend in the first direction DR1.

A first power line VDL may include a first power horizontal auxiliary line VDSBL1 extending in the first direction DR1 and first power vertical auxiliary lines VDSBL2 extending in the second direction DR2.

The second conductive layer CDL2 may further include the first power horizontal auxiliary line VDSBL1.

The third conductive layer CDL3 may include the first power vertical auxiliary lines VDSBL2.

The third conductive layer CDL3 may further include a gate initialization voltage auxiliary line VGIAL and an anode initialization voltage auxiliary line VAIAL.

The gate initialization voltage auxiliary line VGIAL may be electrically connected to the gate initialization voltage line VGIL and may extend in the second direction DR2.

The anode initialization voltage auxiliary line VAIAL may be electrically connected to the anode initialization voltage line VAIL and may extend in the second direction DR2.

The first power vertical auxiliary lines VDSBL2 may be electrically connected to the first power horizontal auxiliary line VDSBL1.

As illustrated in FIG. 11, the driving transistor DT may include the channel portion CHDT, the source electrode SDT and the drain electrode DDT connected to both sides of the channel portion CHDT, and the gate electrode GDT overlapping the channel portion CHDT.

The source electrode SDT of the driving transistor DT may be connected to the drain electrode D2 of the second transistor ST2 and the drain electrode D5 of the fifth transistor ST5.

The drain electrode DDT of the driving transistor DT may be connected to the source electrode S11 of a first sub-transistor ST11 and the source electrode S6 of the sixth transistor ST6.

The channel portion CHDT, the source electrode SDT, and the drain electrode DDT of the driving transistor DT may be made of the semiconductor layer SEL. The source electrode SDT and the drain electrode DDT may be portions of the semiconductor layer SEL made conductive by doping a semiconductor material with ions or impurities.

The gate electrode GDT of the driving transistor DT may be made of the first conductive layer CDL1.

The first transistor ST1 may include the first sub-transistor ST11 and a second sub-transistor ST12 connected in series to each other.

The first sub-transistor ST11 may include the channel portion CH11, the source electrode S11 and the drain electrode D11 connected to both sides of the channel portion CH11, and the gate electrode G11 overlapping the channel portion CH11 and formed of a portion of the scan write line GWL.

The source electrode S11 of the first sub-transistor ST11 may be connected to the drain electrode DDT of the driving transistor DT.

The drain electrode D11 of the first sub-transistor ST11 may be connected to the source electrode S12 of the second sub-transistor ST12.

The second sub-transistor ST12 may include the channel portion CH12, the source electrode S12 and the drain electrode D12 connected to both sides of the channel portion CH12, and the gate electrode G12 overlapping the channel portion CH12 and formed of a protruding portion of the scan write line GWL.

The source electrode S12 of the second sub-transistor ST12 may be connected to the drain electrode D11 of the first sub-transistor ST11.

The drain electrode D12 of the second sub-transistor ST12 may be connected to the source electrode S31 of a third sub-transistor ST31.

The gate electrodes G11 and G12 of the first sub-transistor ST11 and the second sub-transistor ST12 may be different portions of the scan write line GWL made of the first conductive layer CDL1.

The gate electrode GDT of the driving transistor DT may be connected to a first connection electrode CE1 through a first contact hole CT1, and the first connection electrode CE1 may be connected to the drain electrode D12 of the second sub-transistor ST12 through a second contact hole CT2.

The first connection electrode CE1 may be made of the third conductive layer CDL3. The second transistor ST2 may include the channel portion CH2, the source electrode S2 and drain electrode D2 connected to both sides of the channel portion CH2, and the gate electrode G2 overlapping the channel portion CH2 and formed of another portion of the scan write line GWL.

The source electrode S2 of the second transistor ST2 may be connected to a second connection electrode CE2 through a fourth contact hole CT4.

The drain electrode D2 of the second transistor ST2 may be connected to the source electrode SDT of the driving transistor DT and the drain electrode D5 of the fifth transistor ST5.

The channel portion CH2, the source electrode S2 and the drain electrode D2 of the second transistor ST2 may be made of the semiconductor layer SEL. The source electrode S2 and the drain electrode D2 may be portions of the semiconductor layer SEL made conductive by doping the semiconductor material with ions or impurities.

The gate electrode G2 of the second transistor ST2 may be a portion of the scan write line GWL made of the first conductive layer CDL1.

The second connection electrode CE2 may be made of the third conductive layer CDL3.

The third transistor ST3 may include the third sub-transistor ST31 and a fourth sub-transistor ST32 connected in series to each other.

The third sub-transistor ST31 may include the channel portion CH31, the source electrode S31 and the drain electrode D31 connected to both sides of the channel portion CH31, and the gate electrode G31 overlapping the channel portion CH31.

The source electrode S31 of the third sub-transistor ST31 may be connected to the drain electrode D12 of the second sub-transistor ST12.

The drain electrode D31 of the third sub-transistor ST31 may be connected to the source electrode S32 of the fourth sub-transistor ST32.

The fourth sub-transistor ST32 may include the channel portion CH32, the source electrode S32 and the drain electrode D32 connected to both sides of the channel portion CH32, and the gate electrode G32 overlapping the channel portion CH32.

The drain electrode D32 of the fourth sub-transistor ST32 may be connected to the gate initialization voltage auxiliary line VGIAL through a second initialization contact hole VICH2.

The channel portion CH31, the source electrode S31 and the drain electrode D31 of the third sub-transistor ST31 and the channel portion CH32, the source electrode S32 and the drain electrode D32 of the fourth sub-transistor ST32 may be made of the semiconductor layer SEL. The source electrodes S31 and S32 and the drain electrodes D31 and D32 of the third sub-transistor ST31 and the fourth sub-transistor ST32 may be portions of the semiconductor layer SEL made conductive by doping the semiconductor material with ions or impurities.

The gate electrodes G31 and G32 of the third sub-transistor ST31 and the fourth sub-transistor ST32 may be different portions of the scan initialization line GIL made of the first conductive layer CDL1.

As illustrated in FIG. 12, the circuit layer 120 may further include a shielding electrode SHE overlapping at least a portion of the source electrode S31 of the fourth sub-transistor ST32.

The shielding electrode SHE may be made of the second conductive layer CDL2.

The shielding electrode SHE may be connected to each of the first power vertical auxiliary lines VDSBL2 through a third contact hole CT3.

The shielding electrode SHE may further overlap a portion of the drain electrode D11 of the first sub-transistor ST11.

Each of the first power vertical auxiliary lines VDSBL2 may be connected to the first power horizontal auxiliary line VDSBL1 through a fifth contact hole CT5.

As illustrated in FIG. 11, the fourth transistor ST4 may include the channel portion CH4, the source electrode S4 and the drain electrode D4 connected to both sides of the channel portion CH4, and the gate electrode G4 overlapping the channel portion CH4 and formed of a portion of the gate control line GCL.

The source electrode S4 of the fourth transistor ST4 may be connected to the drain electrode D6 of the sixth transistor ST6.

The drain electrode D4 of the fourth transistor ST4 may be connected to the anode initialization auxiliary line VAIAL through a fourth initialization contact hole VACH2.

The channel portion CH4, the source electrode S4 and the drain electrode D4 of the fourth transistor ST4 may be made of the semiconductor layer SEL. The source electrode S4 and the drain electrode D4 may be portions of the semiconductor material made conductive by doping the semiconductor material with ions or impurities.

The gate electrode G4 of the fourth transistor ST4 may be a portion of the gate control line GCL made of the first conductive layer CDL1.

The fifth transistor ST5 may include the channel portion CH5, the source electrode S5 and the drain electrode D5 connected to both sides of the channel portion CH5, and the gate electrode G5 overlapping the channel portion CH5 and formed of a portion of the emission control line ECL.

The source electrode S5 of the fifth transistor ST5 may be connected to each of the first power vertical auxiliary lines VDSBL2 through a sixth contact hole CT6.

The drain electrode D5 of the fifth transistor ST5 may be connected to the source electrode SDT of the driving transistor DT.

The sixth transistor ST6 may include the channel portion CH6, the source electrode S6 and the drain electrode D6 connected to both sides of the channel portion CH6, and the gate electrode G6 overlapping the channel portion CH6 and formed of another portion of the emission control line ECL.

The source electrode S6 of the sixth transistor ST6 may be connected to the drain electrode DDT of the driving transistor DT.

The drain electrode D6 of the sixth transistor ST6 may be connected to the source electrode S4 of the fourth transistor ST4 and may be connected to a third connection electrode CE3 through a seventh contact hole CT7.

As illustrated in FIG. 12, the third connection electrode CE3 may be made of the third conductive layer CDL3.

As illustrated in FIG. 11, the channel portion CH5, the source electrode S5 and the drain electrode D5 of the fifth transistor ST5 may be made of the semiconductor layer SEL. The source electrode S5 and the drain electrode D5 may be portions of the semiconductor layer SEL made conductive by doping the semiconductor material with ions or impurities.

The channel portion CH6, the source electrode S6 and the drain electrode D6 of the sixth transistor ST6 may be made of the semiconductor layer SEL. The source electrode S6 and the drain electrode D6 may be portions of the semiconductor layer SEL made conductive by doping the semiconductor material with ions or impurities.

The gate electrodes G5 and G6 of the fifth transistor ST5 and the sixth transistor ST6 may be different portions of the emission control line ECL made of the first conductive layer CDL1.

As illustrated in FIG. 12, a capacitor C1 may be provided by the overlap of a first capacitor electrode CAE1 and a second capacitor electrode CAE2.

Here, the first capacitor electrode CAEI may be a portion of the gate electrode GDT of the driving transistor DT made of the first conductive layer CDL1.

The second capacitor electrode CAE2 may be a portion of the first power horizontal auxiliary line VDSBL1 made of the second conductive layer CDL2.

The second connection electrode CE2 is connected to the source electrode S2 of the second transistor ST2 through the fourth contact hole CT4.

Referring to FIG. 10, the fourth conductive layer CDL4 of the circuit layer 120 may include a first power auxiliary line VDAL and second detour lines DETL2 extending in the first direction DR1.

As illustrated in FIG. 6, since the second detour lines DETL2 are part of the first dummy lines DML1, the fourth conductive layer CDL4 may include the first power auxiliary lines VDAL and the first dummy lines DML1.

As illustrated in FIG. 6, the first dummy lines DML1 include the second detour lines DETL2 of the input detour lines IDEL and the first auxiliary lines ASL1 which are portions other than the second detour lines DETL2 and to which the second power ELVSS is applied.

The first dummy lines DML1 and the first power auxiliary lines VDAL may be alternately disposed in the second direction DR2.

As illustrated in FIG. 10, the fourth conductive layer CDL4 may further include a fourth connection electrode CE4 and a fifth connection electrode CE5.

The fourth connection electrode CE4 may be connected to the second connection electrode CE2 through a tenth contact hole CT10.

The fifth connection electrode CE5 may be electrically connected to the third connection electrode CE3 through an eighth contact hole CT8.

The first power auxiliary line VDAL may be electrically connected to each of the first power vertical auxiliary lines VDSBL2 of the third conductive layer CDL3 through an eleventh contact hole CT11.

The fifth conductive layer CDL5 may include data lines DL and second dummy lines DML2.

The data lines DL include a first data line DL1 and a second data line DL2 disposed in the first display side area DSDA1.

The second dummy lines DML2 respectively neighboring the data lines DL may include a first detour line DETL1 and a third detour line DETL3 of each input detour line IDEL and second auxiliary lines ASL2 which are portions other than the first detour line DETL1 and the third detour line DETL3 and to which the second power ELVSS is applied.

The second auxiliary lines ASL2 may include a general auxiliary line GASL extending between both ends of the display area DA in the second direction DR2, a first auxiliary extension line EASL1 spaced apart from an end of the first detour line DETL1, and a second extension auxiliary line EASL2 spaced apart from an end of the third detour line DETL3.

The first data line DL1 may neighbor the general auxiliary line GASL on one side in the first direction DR1.

The second data line DL2 may neighbor the third detour line DETL3 and the second extension auxiliary line EASL2 on one side in the first direction DR1.

Each of the data lines DL may be electrically connected to the fourth connection electrode CE4 through a data connection hole DTCH.

Therefore, the source electrode S2 of the second transistor ST2 may be electrically connected to each of the data lines DL through the second connection electrode CE2 and the fourth connection electrode CE4.

The fifth conductive layer CDL5 may further include a sixth connection electrode CE6.

The sixth connection electrode CE6 may be electrically connected to the fifth connection electrode CE5 through a ninth contact hole CT9.

The fifth connection electrode CE5 may be electrically connected to the third connection electrode CE3, and the third connection electrode CE3 may be electrically connected to the source electrode S4 of the fourth transistor ST4 and the drain electrode D6 of the sixth transistor ST6.

The sixth connection electrode CE6 may be electrically connected to the source electrode S4 of the fourth transistor ST4 and the drain electrode D6 of the sixth transistor ST6 through the third connection electrode CE3 and the fifth connection electrode CE5.

The sixth connection electrode CE6 may be electrically connected to an anode AND (see FIG. 13) of a light emitting element LEL through an anode contact hole ANCT (see FIG. 13) penetrating the third planarization layer 127.

In the first display side area DSDA1, the third detour line DETL3 may be electrically connected to a second detour line DETL2 through a second detour connection hole DECH2 penetrating the second planarization layer 126.

As illustrated in FIG. 13, the circuit layer 120 may include the semiconductor layer SEL on the substrate 110, the first conductive layer CDL1 on the first gate insulating layer 122 covering the semiconductor layer SEL, the second conductive layer CDL2 on the second gate insulating layer 123 covering the first conductive layer CDL1, the third conductive layer CDL3 on the interlayer insulating layer 124 covering the second conductive layer CDL2, the fourth conductive layer CDL4 on the first planarization layer 125 covering the third conductive layer CDL3, the fifth conductive layer CDL5 on the second planarization layer 126 covering the fourth conductive layer CDL4, and the third planarization layer 127 covering the fifth conductive layer CDL5.

The circuit layer 120 may further include a buffer layer 121 disposed between the substrate 110 and the semiconductor layer SEL.

The buffer layer 121 may be designed to protect the circuit layer 120 and the light emitting element layer 130 from moisture introduced through the substrate 110 and may be made of at least one inorganic layer.

For example, the buffer layer 121 may be a multilayer in which one or more inorganic layers selected from silicon nitride, silicon oxynitride, silicon oxide, titanium oxide, and aluminum oxide are alternately stacked on each other.

The semiconductor layer SEL may be disposed on the buffer layer 121 and may be made of a silicon semiconductor such as polycrystalline silicon, monocrystalline silicon, low-temperature polycrystalline silicon, or amorphous silicon.

The semiconductor layer SEL may include the channel portions CHDT, CH11, CH12, CH2, CH31, CH32, CH4, CH5 and CH6 (see FIG. 11) of the driving transistor DT and the switch elements ST1 through ST6 provided in each pixel driver PXD.

The semiconductor layer SEL may further include the source electrodes SDT, S11, S12, S2, S31, S32, S4, S5 and S6 (see FIG. 11) and the drain electrodes DDT, D11, D12, D2, D31, D32, D4, D5 and D6 (see FIG. 11) of the driving transistor DT and the switch elements ST1 through ST6.

Portions of the semiconductor layer SEL which correspond to the source electrodes SDT, S11, S12, S2, S31, S32, S4, S5 and S6 (see FIG. 11) and the drain electrodes DDT, D11, D12, D2, D31, D32, D4, D5 and D6 (see FIG. 11) of the driving transistor DT and the switch elements ST1 through ST6 may be doped with ions or impurities to have conductivity.

On the other hand, portions of the semiconductor layer SEL which correspond to the channel portions CHDT, CH11, CH12, CH2, CH31, CH32, CH4, CH5 and CH6 (see FIG. 11) of the driving transistor DT and the switch elements ST1 through ST6 may not be doped due to the gate electrodes GDT, G11, G12, G2, G31, G32, G4, G5 and G6 and may maintain semiconductor characteristics of generating channels that serve as passages through which carriers move according to a potential difference.

The first gate insulating layer 122 may be made of an inorganic layer disposed on the buffer layer 121 and covering the semiconductor layer SEL.

For example, the first gate insulating layer 122 may be made of an inorganic layer such as a silicon nitride layer, a silicon oxynitride layer, a silicon oxide layer, a titanium oxide layer, and/or or an aluminum oxide layer.

The first conductive layer CDL1 may be disposed on the first gate insulating layer 122.

The first conductive layer CDL1 may include the gate electrodes GDT, G11, G12, G2, G31, G32, G4, G5 and G6 of the driving transistor DT and the switch elements ST1 through ST6 provided in each pixel driver PXD.

The first conductive layer CDL1 may further include the scan write line GWL, the scan initialization line GIL, the gate control line GCL and the emission control line ECL connected to the gate electrodes G11, G12, G2, G31, G32, G4, G5 and G6 of the first through sixth transistors ST1 through ST6 in each pixel driver PXD and extending in the first direction DR1.

The first conductive layer CDL1 may be a single layer or a multilayer made of any one or more of molybdenum (Mo), aluminum (Al), chromium (Cr), gold (Au), titanium (Ti), nickel (Ni), neodymium (Nd), copper (Cu), and alloys thereof.

The second gate insulating layer 123 may be made of an inorganic layer disposed on the first gate insulating layer 122 and covering the first conductive layer CDL1.

For example, the second gate insulating layer 123 may be made of an inorganic layer such as a silicon nitride layer, a silicon oxynitride layer, a silicon oxide layer, a titanium oxide layer, and/or an aluminum oxide layer.

The second conductive layer CDL2 may be disposed on the second gate insulating layer 123.

The second conductive layer CDL2 may include the shielding electrode SHE (see FIG. 12), the first power horizontal auxiliary line VDSBL1 (see FIG. 12), the gate initialization voltage line VGIL (see FIG. 12), and the anode initialization voltage line VAIL (see FIG. 12).

The second conductive layer CDL2 may be a single layer or a multilayer made of any one or more of molybdenum (Mo), aluminum (Al), chromium (Cr), gold (Au), titanium (Ti), nickel (Ni), neodymium (Nd), copper (Cu), and alloys thereof.

The interlayer insulating layer 124 may be made of an inorganic layer disposed on the second gate insulating layer 123 and covering the second conductive layer CDL2.

For example, the interlayer insulating layer 124 may be made of an inorganic layer such as a silicon nitride layer, a silicon oxynitride layer, a silicon oxide layer, a titanium oxide layer, and/or an aluminum oxide layer.

The third conductive layer CDL3 may be disposed on the interlayer insulating layer 124.

The third conductive layer CDL3 may include the first connection electrode CE1 (see FIG. 12), the second connection electrode CE2 (see FIG. 12), the third connection electrode CE3 (see FIG. 12), the first power vertical auxiliary lines VDSBL2 (see FIG. 12), the gate initialization voltage line VGIL (see FIG. 12), and the anode initialization voltage line VAIL.

Referring to FIGS. 12 and 13, each pixel driver PXD may include the first contact hole CT1, the second contact hole CT2, the third contact hole CT3, the fourth contact hole CT4, the fifth contact hole CT5, the sixth contact hole CT6, and the seventh contact hole CT7.

The first contact hole CT1 may be designed to connect the first connection electrode CE1 and the gate electrode GDT of the driving transistor DT.

The first contact hole CT1 may correspond to a portion of the gate electrode GDT of the driving transistor DT and may penetrate the second gate insulating layer 123 and the interlayer insulating layer 124. Therefore, the first connection electrode CE1 made of the third conductive layer CDL3 may be electrically connected to the gate electrode GDT of the driving transistor DT made of the first conductive layer CDL1 through the first contact hole CT1.

The second contact hole CT2 may be designed to connect any one of the drain electrode D12 of the second sub-transistor ST12 and the source electrode S31 of the third sub-transistor ST31 to the first connection electrode CE1. The drain electrode D12 of the second sub-transistor ST12 and the source electrode S31 of the third sub-transistor ST31 may be connected to each other.

The second contact hole CT2 may correspond to a portion of any one of the drain electrode D12 of the second sub-transistor ST12 and the source electrode S31 of the third sub-transistor ST31 and may penetrate the first gate insulating layer 122, the second gate insulating layer 123 and the interlayer insulating layer 124. Therefore, the first connection electrode CE1 made of the third conductive layer CDL3 may be electrically connected to the drain electrode D12 of the second sub-transistor ST12 and the source electrode S31 of the third sub-transistor ST31, which are made of the semiconductor layer SEL, through the second contact hole CT2.

The gate electrode GDT of the driving transistor DT may be electrically connected to the drain electrode D12 of the second sub-transistor ST12 and the source electrode S31 of the third sub-transistor ST31 through the first contact hole CT1, the second contact hole CT2, and the first connection electrode CE1.

The third contact hole CT3 may be designed to connect the shielding electrode SHE and each of the first power vertical auxiliary lines VDSBL2.

The third contact hole CT3 may correspond to a portion of each first power vertical auxiliary line VDSBL2 and may penetrate the interlayer insulating layer 124. Therefore, the shielding electrode SHE made of the second conductive layer CDL2 may be electrically connected to each first power vertical auxiliary line VDSBL2 made of the third conductive layer CDL3 through the third contact hole CT3.

The fourth contact hole CT4 may be designed to connect the second connection electrode CE2 and the source electrode S2 of the second transistor ST2.

The fourth contact hole CT4 may correspond to a portion of the source electrode S2 of the second transistor ST2 and may penetrate the first gate insulating layer 122, the second gate insulating layer 123 and the interlayer insulating layer 124. Therefore, the second connection electrode CE2 made of the third conductive layer CDL3 may be electrically connected to the source electrode S2 of the second transistor ST2 made of the semiconductor layer SEL through the fourth contact hole CT4.

The fifth contact hole CT5 may be designed to connect the first power horizontal auxiliary line VDSBL1 and each of the first power vertical auxiliary lines VDSBL2.

The fifth contact hole CT5 may correspond to a portion of the first power horizontal auxiliary line VDSBL1 and may penetrate the interlayer insulating layer 124. Therefore, each of the first power vertical auxiliary lines VDSBL2 made of the third conductive layer CDL3 may be electrically connected to the first power horizontal auxiliary line VDSBL1 made of the second conductive layer CDL2 through the fifth contact hole CT5.

The sixth contact hole CT6 may be designed to connect each of the first power vertical auxiliary lines VDSBL2 and the source electrode S5 of the fifth transistor ST5.

The sixth contact hole CT6 may correspond to a portion of the source electrode S5 of the fifth transistor ST5 and may penetrate the first gate insulating layer 122, the second gate insulating layer 123 and the interlayer insulating layer 124. Therefore, each of the first power vertical auxiliary lines VDSBL2 made of the third conductive layer CDL3 may be electrically connected to the source electrode S5 of the fifth transistor ST5 made of the semiconductor layer SEL through the sixth contact hole CT6.

The seventh contact hole CT7 may be designed to connect the third connection electrode CE3 and the drain electrode D6 of the sixth transistor ST6.

The seventh contact hole CT7 may correspond to a portion of the drain electrode D6 of the sixth transistor ST6 and may penetrate the first gate insulating layer 122, the second gate insulating layer 123 and the interlayer insulating layer 124. Therefore, the third connection electrode CE3 made of the third conductive layer CDL3 may be electrically connected to the drain electrode D6 of the sixth transistor ST6 made of the semiconductor layer SEL through the seventh contact hole CT7.

The third conductive layer CDL3 may have a multilayer structure including a metal layer having a low-resistance property and metal layers having an ion diffusion preventing property and disposed on upper and lower surfaces of the above metal layer, respectively.

For example, the third conductive layer CDL3 may have a stacked structure of metal layers, and each of the metal layers of the third conductive layer CDL3 may be made of at least one of molybdenum (Mo), aluminum (Al), chromium (Cr), gold (Au), titanium (Ti), nickel (Ni), neodymium (Nd), and copper (Cu).

Specifically, the metal layer having a low-resistance property may be made of at least one of aluminum (Al), chromium (Cr), gold (Au), nickel (Ni), neodymium (Nd), and copper (Cu).

The metal layers having an ion diffusion preventing property may be made of titanium (Ti).

For example, the third conductive layer CDL3 may have a stacked structure (Ti/Al/Ti) of titanium (Ti)/aluminum (Al)/titanium (Ti).

The first planarization layer 125 covering the third conductive layer CDL3 may be made of an organic layer such as acryl resin, epoxy resin, phenolic resin, polyamide resin, or polyimide resin.

The fourth conductive layer CDL4 may be disposed on the first planarization layer 125.

As illustrated in FIG. 10, the fourth conductive layer CDL4 may include the first power auxiliary line VDAL, the first dummy lines DML1, the fourth connection electrode CE4, and the fifth connection electrode CE5.

The first dummy lines DML1 include the second detour lines DETL2 and the first auxiliary lines ASL1.

The fourth conductive layer CDL4 may be a single layer or a multilayer made of any one or more of molybdenum (Mo), aluminum (Al), chromium (Cr), gold (Au), titanium (Ti), nickel (Ni), neodymium (Nd), copper (Cu), and alloys thereof.

Like the third conductive layer CDL3, the fourth conductive layer CDL4 may have a stacked structure of metal layers, and each of the metal layers of the third conductive layer CDL3 may be made of at least one of molybdenum (Mo), aluminum (Al), chromium (Cr), gold (Au), titanium (Ti), nickel (Ni), neodymium (Nd), and copper (Cu).

For example, the fourth conductive layer CDL4 may have a stacked structure (Ti/Al/Ti) of titanium (Ti)/aluminum (Al)/titanium (Ti).

The second planarization layer 126 covering the fourth conductive layer CDL4 may be made of an organic layer such as acryl resin, epoxy resin, phenolic resin, polyamide resin, and/or polyimide resin.

The fifth conductive layer CDL5 may be disposed on the second planarization layer 126.

As illustrated in FIG. 10, the fifth conductive layer CDL5 may include the data lines DL, the second dummy lines DML2, and the sixth connection electrode CE6.

The second dummy lines DML2 may include the first detour line DETL1, the third detour line DETL3, and the second auxiliary lines ASL2.

The fifth conductive layer CDL5 may be a single layer or a multilayer made of any one or more of molybdenum (Mo), aluminum (Al), chromium (Cr), gold (Au), titanium (Ti), nickel (Ni), neodymium (Nd), copper (Cu), and alloys thereof.

As illustrated in FIG. 13, the third planarization layer 127 covering the fifth conductive layer CDL5 may be made of an organic layer such as acryl resin, epoxy resin, phenolic resin, polyamide resin, and/or polyimide resin.

Referring to FIGS. 10 and 13, each pixel driver PXD may further include the eighth contact hole CT8, the ninth contact hole CT9, the tenth contact hole CT10, and the eleventh contact hole CT11.

The eighth contact hole CT8 may be designed to connect the third connection electrode CE3 and the fifth connection electrode CE5.

The eighth contact hole CT8 may correspond to a portion of the third connection electrode CE3 and may penetrate the first planarization layer 125. Therefore, the fifth connection electrode CE5 may be electrically connected to the third connection electrode CE3 through the eighth contact hole CT8.

The ninth contact hole CT9 may be designed to connect the fifth connection electrode CE5 and the sixth connection electrode CE6.

The ninth contact hole CT9 may correspond to a portion of the fifth connection electrode CE5 and may penetrate the second planarization layer 126. Therefore, the sixth connection electrode CE6 may be electrically connected to the fifth connection electrode CE5 through the ninth contact hole CT9.

The tenth contact hole CT10 may be designed to connect the fourth connection electrode CE4 and the second connection electrode CE2.

The tenth contact hole CT10 may correspond to a portion of the second connection electrode CE2 and may penetrate the first planarization layer 125. Therefore, the fourth connection electrode CE4 may be electrically connected to the second connection electrode CE2 through the tenth contact hole CT10.

The data connection hole DTCH may be designed to electrically connect the fourth connection electrode CE4 and each of the data lines DL.

The data connection hole DTCH may correspond to a portion of the fourth connection electrode CE4 and may penetrate the second planarization layer 126. Therefore, each of the data lines DL may be electrically connected to the fourth connection electrode CE4 through the data connection hole DTCH.

As illustrated in FIG. 13, the light emitting element layer 130 may be disposed on the third planarization layer 127 of the circuit layer 120.

For example, the light emitting element layer 130 may include anodes AND which are disposed on the third planarization layer 127, respectively correspond to the emission areas EA and are respectively electrically connected to the pixel drivers PXD, a pixel defining layer PDL which may be disposed on the third planarization layer 127, corresponds to the non-emission area NEA between the emission areas EA and covers edges of the anodes AND, light emitting layers EML which respectively correspond to the emission areas EA and are respectively disposed on the anodes AND, and a cathode CTD which corresponds to the emission areas EA and may be disposed on the pixel defining layer PDL and the light emitting layers EML.

The cathode CTD may be electrically connected to the second power supply line VSSPL.

Each of the anodes AND may be connected to the sixth connection electrode CE6 through the anode contact hole ANCT penetrating the third planarization layer 127.

Therefore, each of the anodes AND may be electrically connected to a pixel driver PXD through the seventh contact hole CT7, the third connection electrode CE3, the eighth contact hole CT8, the fifth connection electrode CE5, the ninth contact hole CT9, the sixth connection electrode CE6, and the anode contact hole ANCT.

The pixel defining layer PDL may be made of an organic layer.

The light emitting layers EML may include an organic light emitting material.

Although not separately illustrated, a first common layer (not illustrated) including at least a hole transport material may be disposed between the anodes AND and the light emitting layers EML.

A second common layer (not illustrated) including at least an electron transport material may be disposed between the light emitting layers EML and the cathode CTD.

The cathode CTD may correspond to the entire display area DA.

Although not separately illustrated, the cathode CTD may be connected to the second power supply line VSSPL in the non-display area NDA.

Therefore, the light emitting element layer 130 may include multiple light emitting elements LEL respectively corresponding to the emission areas EA and each including an anode AND and the cathode CTD facing each other and a light emitting layer EML interposed between them.

The light emitting element layer 130 may be covered with the sealing layer 140 for blocking penetration of oxygen or moisture.

The sealing layer 140 may cover the light emitting element layer 130 and may have a structure in which at least one inorganic layer and at least one organic layer are alternately stacked on each other.

For example, the sealing layer 140 may include a first inorganic layer 141 covering the cathode CTD and made of an inorganic insulating material, an organic layer 142 disposed on the first inorganic layer 141 and made of an organic insulating material, and a second inorganic layer 143 covering the organic layer 142 and made of an inorganic insulating material.

Figure 14:
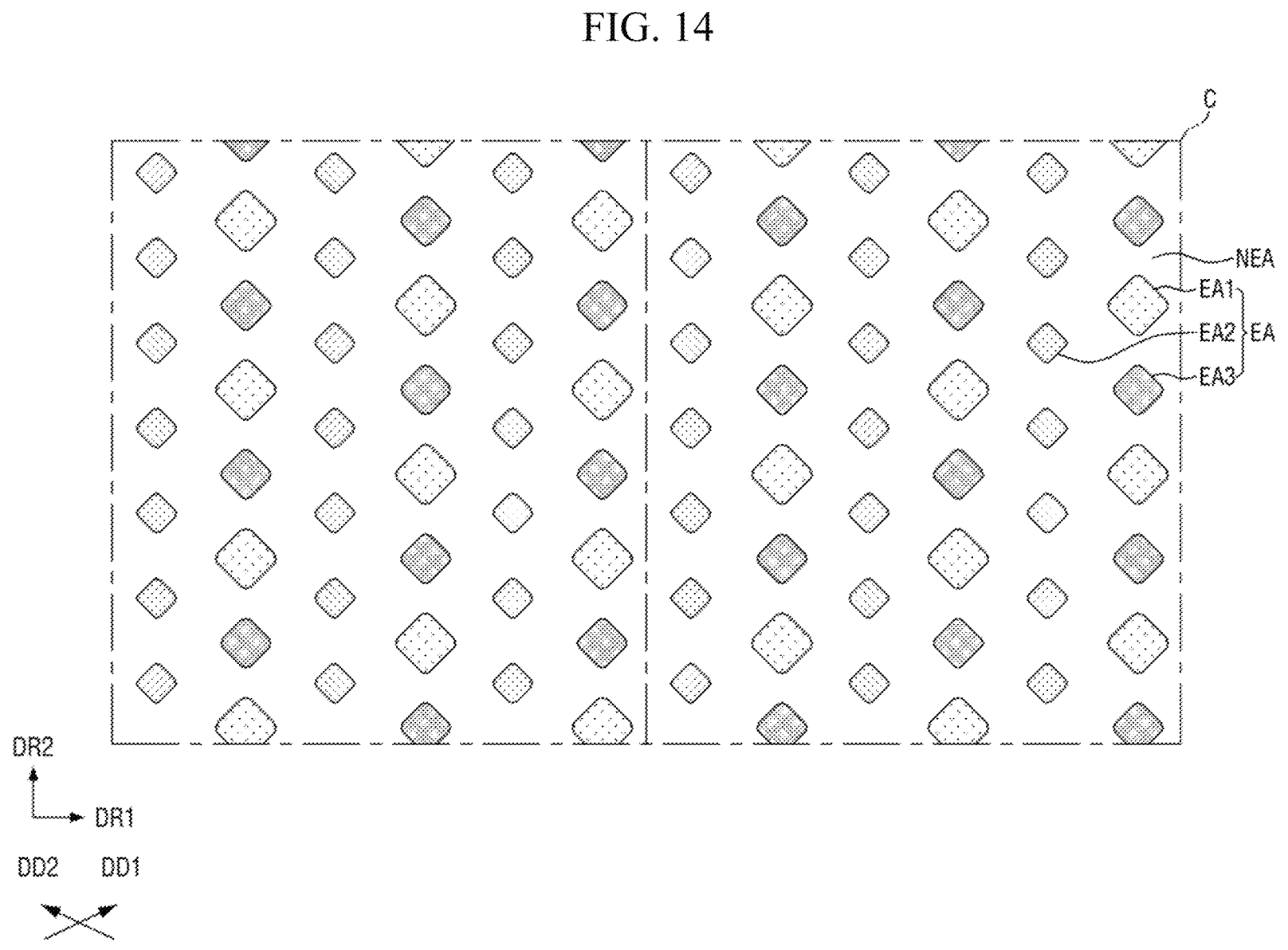

FIG. 14 is a schematic plan view illustrating an example of the emission areas EA disposed in portion C of FIGS. 4 and 5.

Referring to FIG. 14, the emission areas EA of the display device 10 according to the embodiment may include the first emission areas EA1, the second emission areas EA2, and the third emission areas EA3.

The first emission areas EA1 and the third emission areas EA3 may be alternately arranged in each of the first direction DR1 and the second direction DR2.

The second emission areas EA2 may neighbor the first emission areas EA1 or the third emission areas EA3 in the first diagonal direction DD1 or the second diagonal direction DD2.

The second emission areas EA2 may be arranged side by side in each of the first direction DR1 and the second direction DR2.

The non-emission area NEA may be disposed around each of the emission areas EA.

Figure 16:
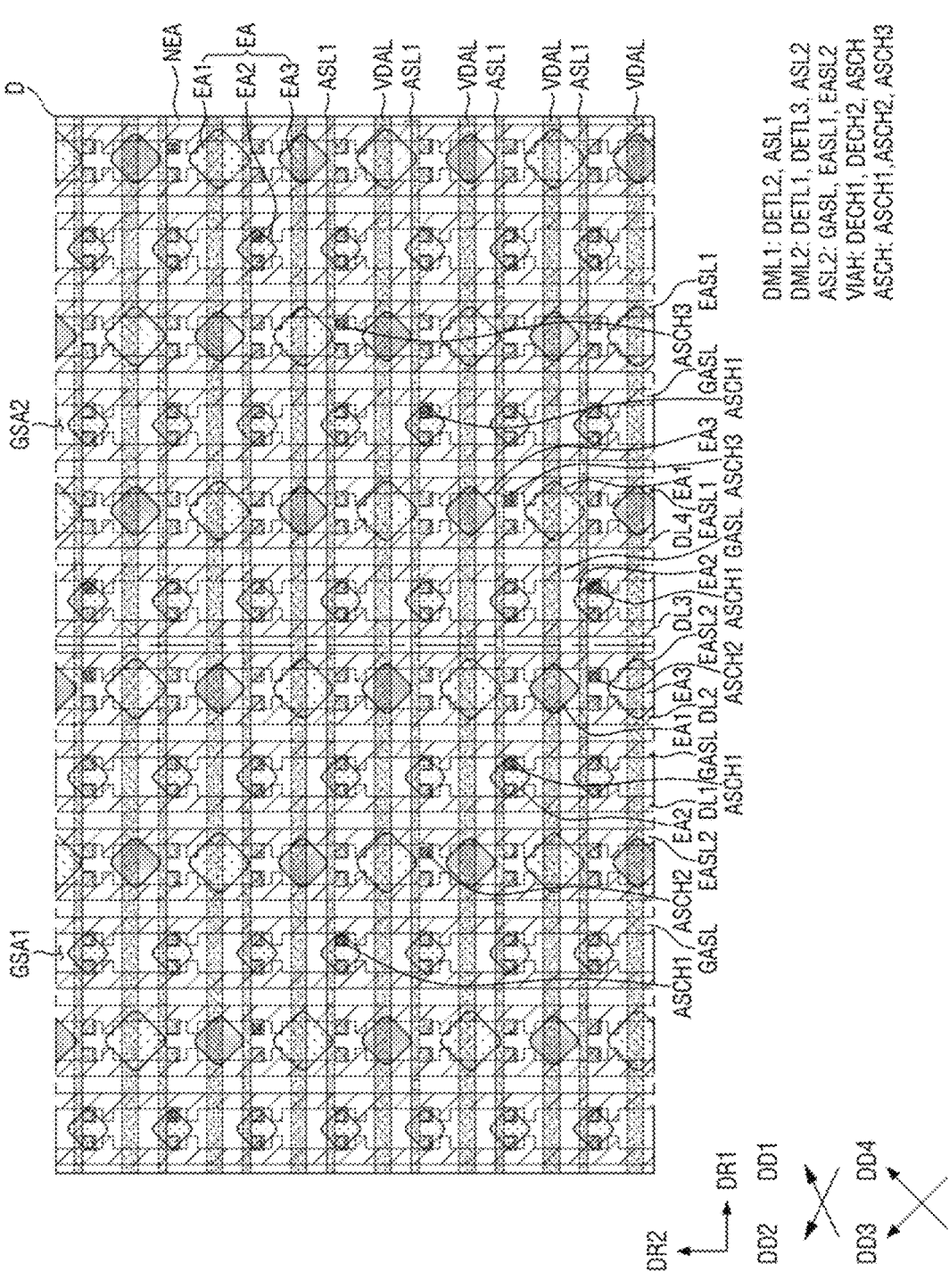
FIG. 16 is a schematic plan view illustrating the emission areas and the via holes disposed in portion D of FIG. 4 in the display device according to an embodiment of FIG. 15.

FIG. 15 is a schematic plan view illustrating emission areas EA and via holes VIAH disposed in portion C of FIGS. 4 and 5 in a display device 10 according to an embodiment. FIG. 16 is a schematic plan view illustrating the emission areas EA and the via holes VIAH disposed in portion D of FIG. 4 in the display device 10 according to an embodiment of FIG. 15.

Referring to FIGS. 15 and 16, the display device 10 according to an embodiment includes the via holes VIAH for electrical connection between first dummy lines DML1 and second dummy lines DML2.

Some of the via holes VIAH may overlap one of the emission areas EA, and the other via holes may be disposed in a non-emission area NEA.

As described above with reference to FIGS. 5 and 6, according to an embodiment, the first dummy lines DML1 may include second detour lines DETL2 of input detour lines IDEL for electrically connecting first demux circuit units DMC1 and first data supply lines DSPL1 and first auxiliary lines ASL1 electrically connected to a second power supply line VSSPL to receive second power ELVSS.

The second dummy lines DML2 may include first detour lines DETL1 and third detour lines DETL3 of the input detour lines IDEL and second auxiliary lines ASL2 electrically connected to the second power supply line VSSPL to receive the second power ELVSS.

The second auxiliary lines ASL2 may include general auxiliary lines GASL extending between both ends of a display area DA in the second direction DR2, first extension auxiliary lines EASL1 spaced apart from ends of the first detour lines DETL1 in the second direction DR2, and second extension auxiliary lines EASL2 spaced apart from ends of the third detour lines DETL3 in the second direction DR2.

Accordingly, as illustrated in FIG. 15, the via holes VIAH may include first detour connection holes DECH1 for electrical connection between the second detour lines DETL2 and the first detour lines DETL1 and second detour connection holes DECH2 for electrical connection between the second detour lines DETL2 and the third detour lines DETL3.

As illustrated in FIG. 16, the via holes VIAH may further include auxiliary connection holes ASCH for electrical connection between the first auxiliary lines ASL1 and the second auxiliary lines ASL2.

The auxiliary connection holes ASCH may include first auxiliary connection holes ASCH1 overlapping the general auxiliary lines GASL, second auxiliary connection holes ASCH2 disposed in a first general side area GSA1 and overlapping the second extension auxiliary lines EASL2, and third auxiliary connection holes ASCH3 disposed in a second general side area GSA2 and overlapping the first extension auxiliary lines EASL1.

According to an embodiment, the first detour connection holes DECH1 and the second detour connection holes DECH2 among the via holes VIAH may be disposed in the non-emission area NEA.

In this case, each of the first auxiliary connection holes ASCH1 among the auxiliary connection holes ASCH may overlap one of the emission areas EA.

The second detour lines DETL2 extend in the first direction DR1 between the first detour lines DETL1 and the third detour lines DETL3, and the first detour connection holes DECH1 and the second detour connection holes DECH2 are disposed at both ends of the second detour lines DETL2.

Therefore, the visibility of end portions at both ends of the second detour lines DETL2 and the visibility of the first detour connection holes DECH1 and the second detour connection holes DECH2 are increased by interaction between them. Accordingly, the image quality of a demux adjacent area DAA becomes different from that of a general area GA, thereby degrading the display quality of the display device 10.

However, according to an embodiment, since the first detour connection holes DECH1 and the second detour connection holes DECH2 are disposed in the non-emission area NEA, the visibility of the first detour connection holes DECH1 and the second detour connection holes DECH2 can be reduced.

Since the first detour connection holes DECH1 and the second detour connection holes DECH2 are disposed in the non-emission area NEA, a light emitting element LEL of each of the emission areas EA may not overlap a first detour connection hole DECH1 or a second detour connection hole DECH2. Accordingly, it is possible to prevent light emission directions of the light emitting elements LEL from becoming different due to the influence of a step difference caused by the first detour connection holes DECH1 and the second detour connection holes DECH2.

Therefore, a decrease in the display quality of the display device 10 due to the input detour lines IDEL can be reduced.

The first extension auxiliary lines EASL1 among the second auxiliary lines ASL2 may be disposed parallel to the first detour lines DETL1 in the second direction DR2 and may be spaced apart from ends of the first detour lines DETL1.

The second extension auxiliary lines EASL2 among the second auxiliary lines ASL2 may be disposed parallel to the third detour lines DETL3 in the second direction DR2 and may be spaced apart from ends of the third detour lines DETL3.

Since each second extension auxiliary line EASL2 of a first display side area DSDA1 and each first extension auxiliary line EASL1 of a second display side area DSDA2 intersect one or more second detour lines DETL2, it is difficult for them to overlap the auxiliary connection holes ASCH.

Therefore, according to the first embodiment, the auxiliary connection holes ASCH may not be disposed in the first display side area DSDA1 and the second display side area DSDA2, but may be disposed in a display middle area DMDA and the general area GA.

As illustrated in FIG. 16, in the first general side area GSA1, the auxiliary connection holes ASCH1 and ASCH2 respectively overlapping the first auxiliary lines ASL1 adjacent thereto in the second direction DR2 may be arranged in the third diagonal direction DD3.

For example, the auxiliary connection holes ASCH of the first general side area GSA1 may include the first auxiliary connection holes ASCH1 and the second auxiliary connection holes ASCH2 arranged in the third diagonal direction DD3 and alternating with each other.

In the second general side area GSA2, the auxiliary connection holes ASCH1 and ASCH3 respectively overlapping the first auxiliary lines ASL1 adjacent thereto in the second direction DR2 may be arranged in the fourth diagonal direction DD4.

For example, the auxiliary connection holes ASCH of the second general side area GSA2 may include the first auxiliary connection holes ASCH1 and the third auxiliary connection holes ASCH3 arranged in the fourth diagonal direction DD4 and alternating with each other.

Figure 17:
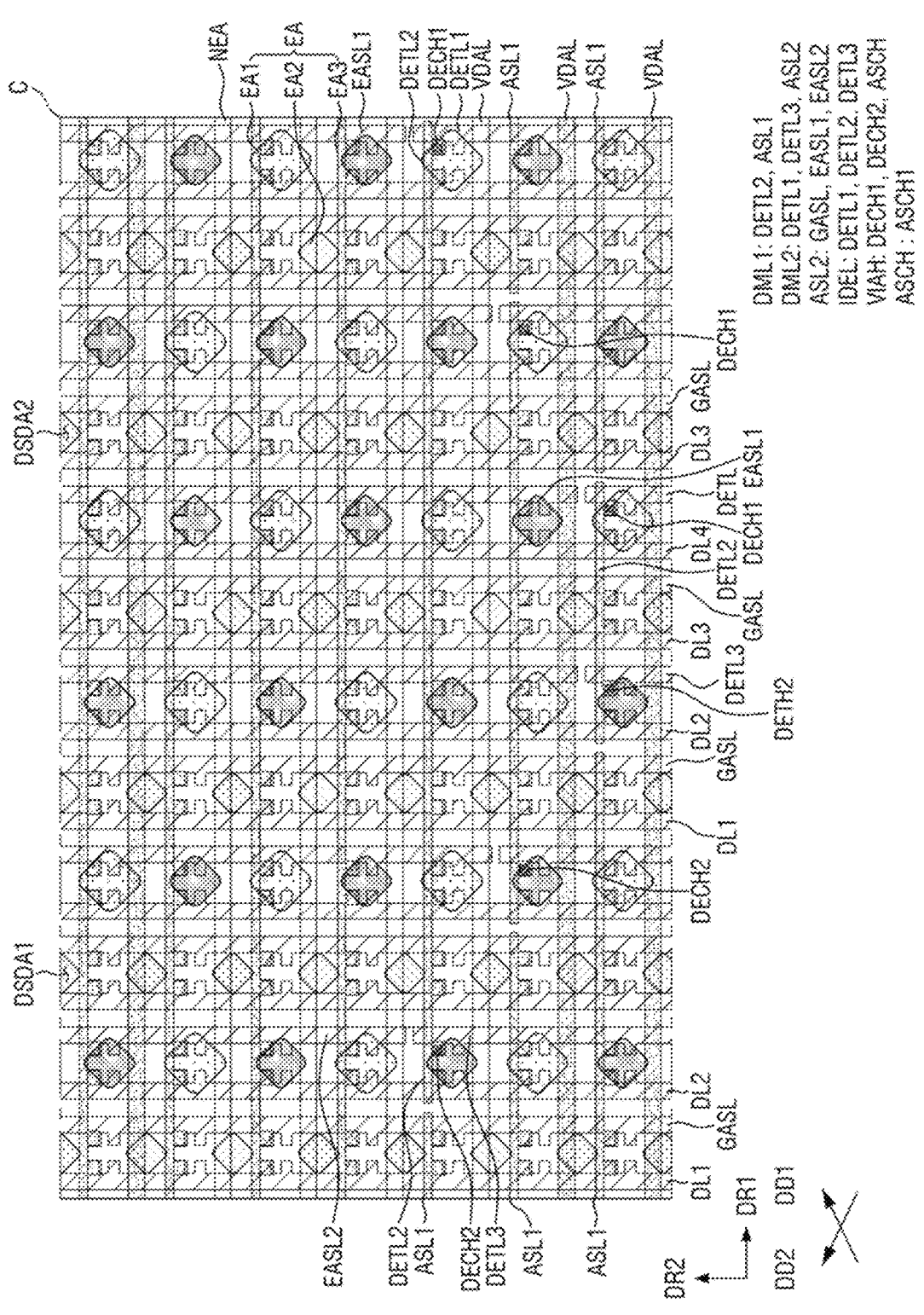
FIG. 17 is a schematic plan view illustrating emission areas and via holes disposed in portion C of FIGS. 4 and 5 in a display device according to another embodiment.

FIG. 17 is a schematic plan view illustrating emission areas EA and via holes VIAH disposed in portion C of FIGS. 4 and 5 in a display device according to another embodiment.

The display device of an embodiment according to FIG. 17 may be the same as an embodiment of FIG. 15 except that first auxiliary connection holes ASCH1 among the via holes VIAH may be disposed in a non-emission area NEA and that each of first and second detour connection holes DECH1 and DECH2 may overlap one of the emission areas EA. Therefore, redundant description will be omitted below.

The first detour connection holes DECH1 and the second detour connection holes DECH2 may be disposed at both ends of second detour lines DETL2 in a demux adjacent area DAA, but one or more first auxiliary connection holes ASCH1 may be disposed in each of first auxiliary lines ASL1 of a display area DA. Accordingly, the number of first auxiliary connection holes ASCH1 may be greater than the total number of first detour connection holes DECH1 and second detour connection holes DECH2 disposed in the demux adjacent area DAA.

Therefore, according to an embodiment of FIG. 17, a relatively large number of first auxiliary connection holes ASCH1 may be disposed in the non-emission area NEA, instead of a relatively small number of first detour connection holes DECH1 and second detour connection holes DECH2. As a result, the visibility of the first auxiliary connection holes ASCH1 can be reduced. Light emission directions of light emitting elements LEL can be prevented from becoming different due to the influence of a step difference caused by the first auxiliary connection holes ASCH1. Accordingly, this can reduce a decrease in the display quality of the display device 10 due to the via holes VIAH.

Figure 19:
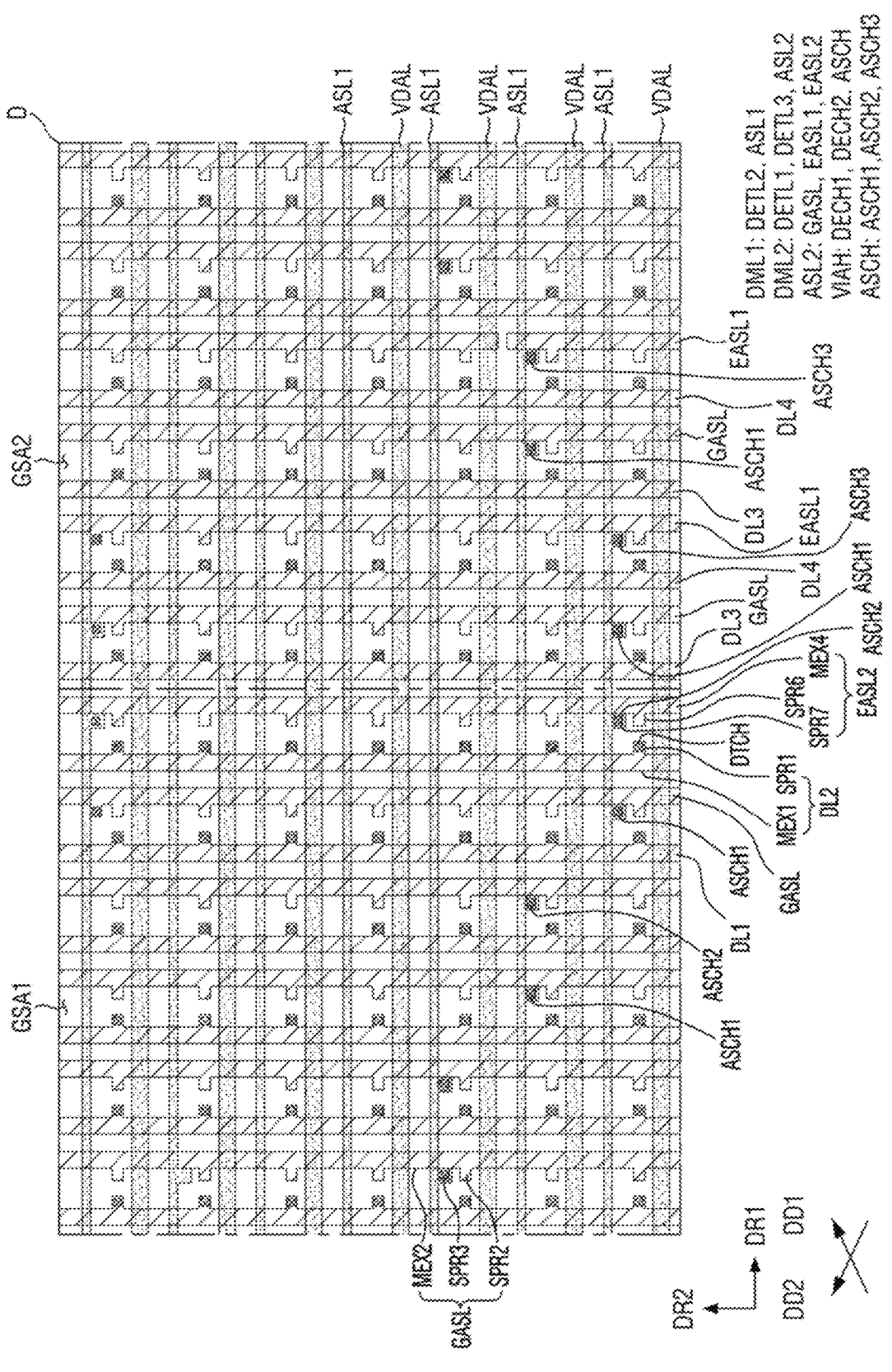
FIG. 19 is a schematic plan view illustrating the data lines, the first dummy lines, the second dummy lines, and the via holes disposed in portion D of FIG. 4 in the display device according to an embodiment of FIG. 18.

FIG. 18 is a schematic plan view illustrating data lines DL, first dummy lines DML1, second dummy lines DML2, and via holes VIAH disposed in portion C of FIGS. 4 and 5 in a display device 10 according to yet another embodiment. FIG. 19 is a schematic plan view illustrating the data lines DL, the first dummy lines DML1, the second dummy lines DML2, and the via holes VIAH disposed in portion D of FIG. 4 in the display device 10 according to an embodiment of FIG. 18.

Referring to FIGS. 18 and 19, the display device 10 according to an embodiment of FIG. 18 may be substantially the same as an embodiment illustrated in FIGS. 15 and 16 or an embodiment illustrated in FIG. 17 except that each of the data lines DL and the second dummy lines DML2 may not include a pair of sub-protrusions protruding toward each adjacent pixel driver PXD and symmetrical to each other but may include only sub-protrusions SPR1 overlapping data connection holes DTCH, sub-protrusions SPR2, SPR4 or SPR6 facing the data connection holes DTCH, a sub-protrusion SPR3 or SPR7 overlapping an auxiliary connection hole ASCH, and a sub-protrusion SPR5 overlapping a first detour connection hole DECH1 or a second detour connection hole DECH2. Therefore, redundant description will be described below.

According to an embodiment of FIG. 18, each of first data lines DL1 and second data lines DL2 disposed in a first display side area DSDA1 and a first general side area GSA1 may include a first main extension portion MEX1 extending in the second direction DR2 and a first sub-protrusion SPR1 protruding from the first main extension portion MEX1 and overlapping the data connection hole DTCH of each adjacent pixel driver PXD.

A general auxiliary line GASL neighboring each of the first data lines DL1 may include a second main extension portion MEX2 extending in the second direction DR2 and second sub-protrusions SPR2 protruding from the second main extension portion MEX2 and facing the first sub-protrusions SPR1 of the first data line DL1.

In a general area GA, each general auxiliary line GASL may further include a third sub-protrusion SPR3 protruding from the second main extension portion MEX2 and overlapping a first auxiliary connection hole ASCH1.

In the first general side area GSA1, first auxiliary connection holes ASCH1 may be disposed in the third sub-protrusions SPR3 of the general auxiliary lines GASL.

The first auxiliary connection holes ASCH1 may be arranged in the second diagonal direction DD2.

Each of third detour lines DETL3 neighboring the second data lines DL2 may include a third main extension portion MEX3 extending in the second direction DR2, fourth sub-protrusions SPR4 protruding from the third main extension portion MEX3 and facing the first sub-protrusions SPR 1 of a second data line DL2, and a fifth sub-protrusion SPR5 facing the first main extension MEX1 of the second data line DL2 and overlapping a second detour connection hole DECH2 among the auxiliary connection holes ASCH.

The fifth sub-protrusion SPR5 may protrude toward one pixel driver PXD adjacent to an intersection of an end of a second detour line DETL2 and one third detour line DETL3.

Each of second extension auxiliary lines EASL2 neighboring the second data lines DL2 may include a fourth main extension portion MEX4 extending in the second direction DR2 and sixth sub-protrusions SPR6 protruding from the fourth main extension portion MEX4 and facing the first sub-protrusions SPR1 of a second data line DL2.

In the general area GA, each of the second extension auxiliary lines EASL2 may further include a seventh sub-protrusion SPR7 protruding from the fourth main extension portion MEX4 and overlapping a second auxiliary connection hole ASCH2.

In the first general side area GSA1, second auxiliary connection holes ASCH2 may be arranged in the second diagonal direction DD2. The arrangement direction of the first auxiliary connection holes ASCH1 may be parallel to the arrangement direction of the second auxiliary connection holes ASCH2.

A second display side area DSDA2 and a second general side area GSA2 may be substantially the same as the first display side area DSDA1 and the first general side area GSA1 except that they may include third data lines DL3 and fourth data lines DL4 instead of the first data lines DL1 and the second data lines DL2 and include first detour lines DETL1 instead of the third detour lines DETL3. The second display side area DSDA2 and the second general side area GSA2 may be substantially similar to the first display side area DSDA1 and the first general side area GSA1, the third data lines DL3 and the fourth data lines DL4 may be similar to the first data lines DL1 and the second data lines DL2, and the first detour lines DETL1 may be similar to the third detour lines DETL3. Therefore, redundant description will be omitted.

As described above, according to an embodiment of FIG. 18, each of the data lines DL and the second dummy lines DML2 may include only sub-protrusions overlapping the via holes VIAH. Therefore, the number of sub-protrusions may be reduced compared with a case where each of the data lines DL and the second dummy lines DML2 includes a pair of sub-protrusions protruding toward each adjacent pixel driver PXD and symmetrical to each other. Accordingly, since the resistance of each of the data lines DL and the second dummy lines DML2 can be lowered as much as the number of sub-protrusions is reduced, RC delay can be reduced.

Figure 20:
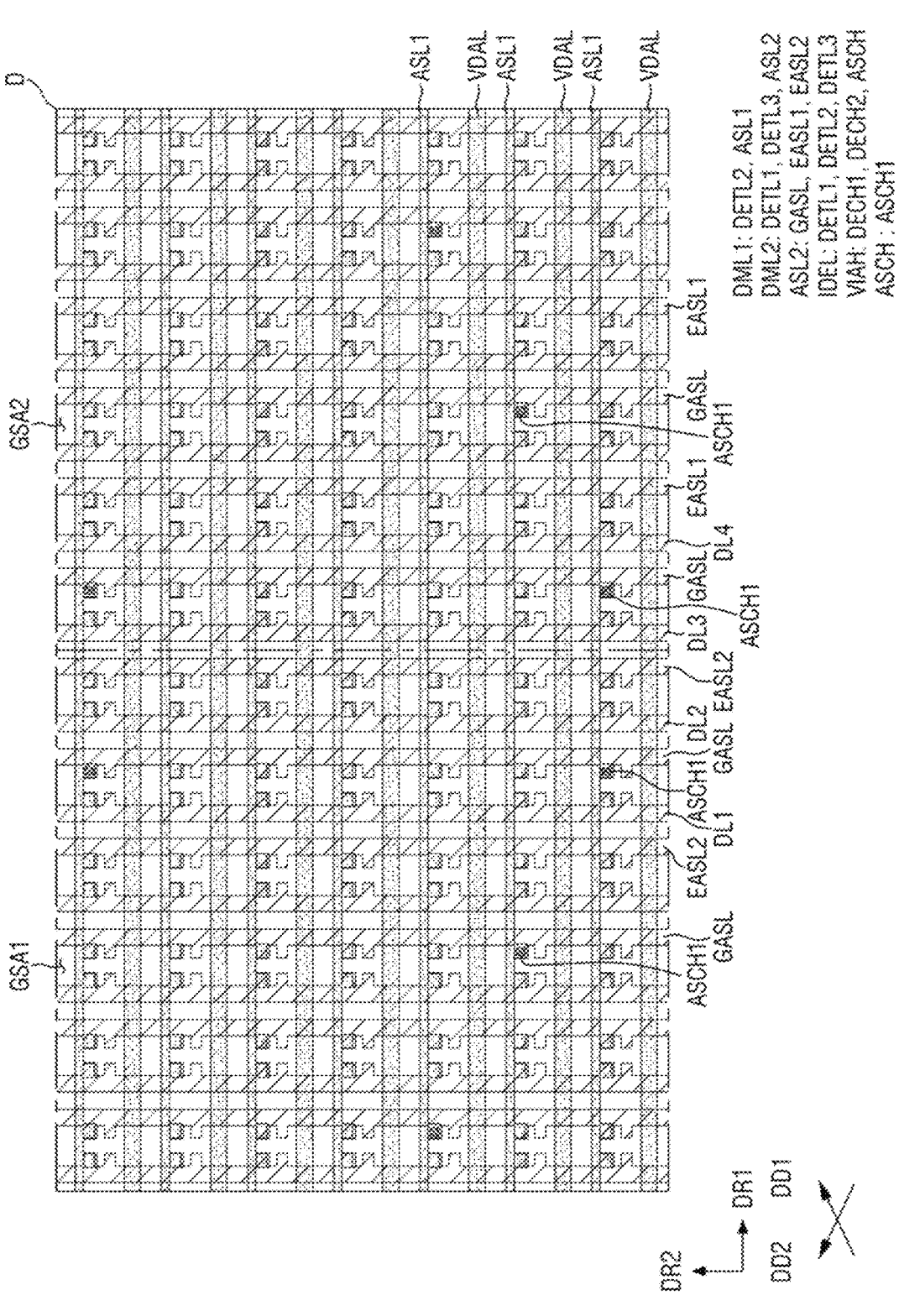
FIG. 20 is a schematic plan view illustrating data lines, first dummy lines, second dummy lines, and via holes disposed in portion D of FIG. 4 in a display device according to still further another embodiment.
Figure 21:
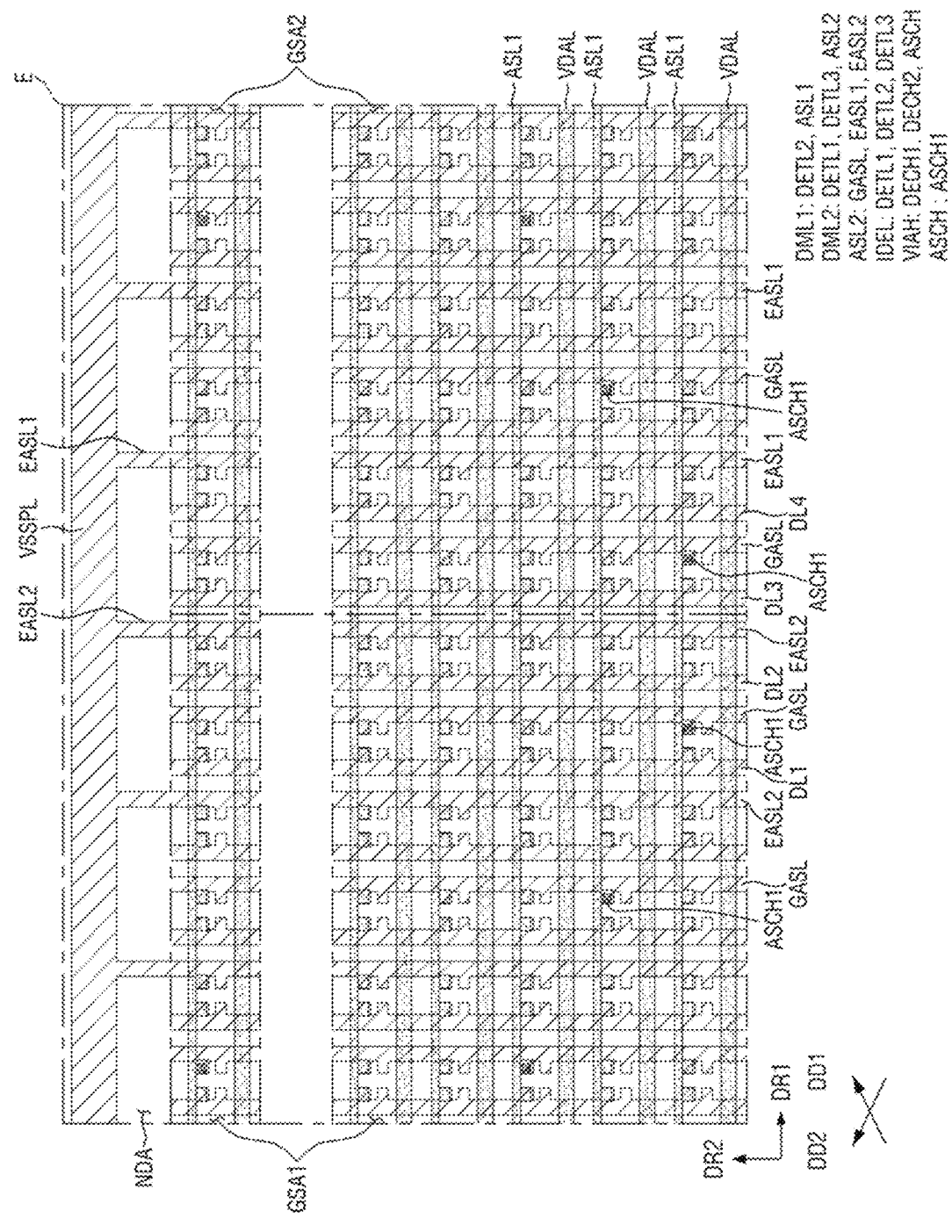
FIG. 21 is a schematic plan view illustrating the data lines, the first dummy lines, the second dummy lines, and the via holes disposed in portion E of FIG. 4 in the display device according to an embodiment of FIG. 20.

FIG. 20 is a schematic plan view illustrating data lines, first dummy lines DML1, second dummy lines DML2, and via holes VIAH disposed in portion D of FIG. 4 in a display device 10 according to still further another embodiment. FIG. 21 is a schematic plan view illustrating the data lines, the first dummy lines DML1, the second dummy lines DML2, and the via holes VIAH disposed in portion E of FIG. 4 in the display device 10 according to an embodiment of FIG. 20.

Referring to FIGS. 20 and 21, the display device 10 according to an embodiment of FIG. 20 may be substantially the same as an embodiment illustrated in FIGS. 15 and 16 or an embodiment illustrated in FIG. 17 except that auxiliary connection holes ASCH may not include second auxiliary connection holes ASCH2 and third auxiliary connection holes ASCH3 and that first extension auxiliary lines EASL1 and second extension auxiliary lines EASL2 may be connected to a second power supply line VSSPL in a non-display area NDA. Therefore, redundant description will be omitted below.

According to an embodiment, the auxiliary connection holes ASCH may include only first auxiliary connection holes ASCH1 overlapping general auxiliary lines GASL.

The first extension auxiliary lines EASL1 and the second extension auxiliary lines EASL2 may not be electrically connected to first auxiliary lines ASL1, but may be directly electrically connected to the second power supply line VSSPL in the non-display area NDA.

In this case, the resistance of second power ELVSS can be lowered due to a mesh structure of the general auxiliary lines GASL and the first auxiliary lines ASL1, while heat generation is reduced due to a reduction in the number of auxiliary connection holes ASCH.

Figure 22:
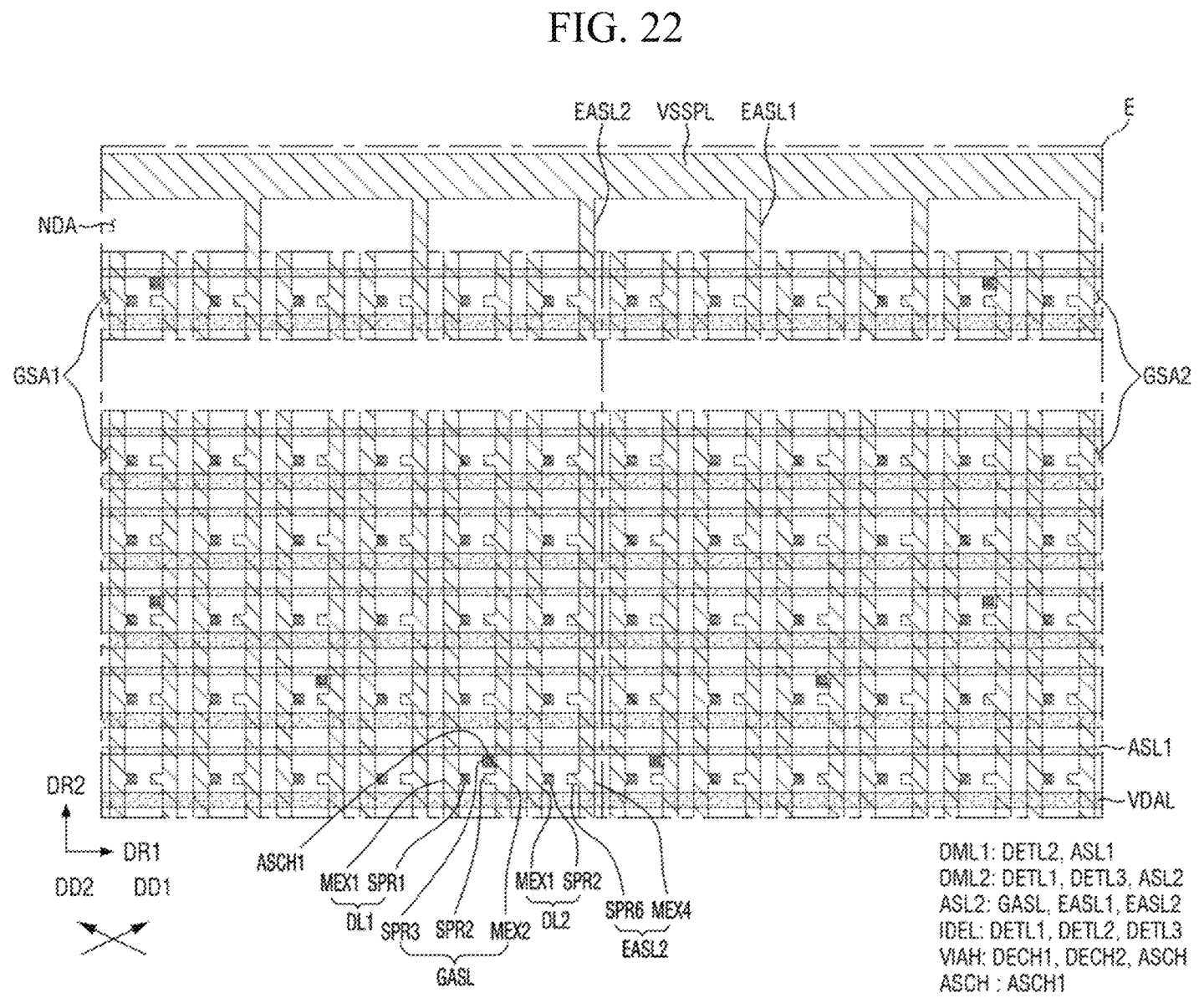

FIG. 22 is a schematic plan view illustrating data lines DL, first dummy lines DML1, second dummy lines DML2, and via holes VIAH disposed in portion E of FIG. 4 in a display device according to another embodiment.

Referring to FIG. 22, the display device according to an embodiment may be substantially the same as an embodiment illustrated in FIGS. 20 and 21 except that each of the data lines DL and the second dummy lines DML2 may include only sub-protrusions overlapping the via holes VIAH, instead of a pair of sub-protrusions protruding toward each adjacent pixel driver PXD and symmetrical to each other. Therefore, redundant description will be omitted below.

As in an embodiment of FIG. 20, according to an embodiment of FIG. 22, auxiliary connection holes ASCH may include only first auxiliary connection holes ASCH1 overlapping general auxiliary lines GASL. Accordingly, each of first extension auxiliary lines EASL1 or second extension auxiliary lines EASL2 may not include a seventh sub-protrusion SPR7 overlapping a second auxiliary connection hole ASCH2 or a third auxiliary connection hole ASCH3, but may include only sixth sub-protrusions SPR6 facing first sub-protrusions SPR1.

A fourth main extension portion MEX4 of each of the first extension auxiliary lines EASL1 and the second extension auxiliary lines EASL2 may extend to a non-display area NDA and may be connected to a second power supply line VSSPL.

An embodiment according to FIG. 22 may be substantially the same as an embodiment illustrated in FIGS. 15 and 16 or an embodiment illustrated in FIG. 17 except that each of the data lines DL and the second dummy lines DML2 may include only sub-protrusions SPR1 overlapping data connection holes DTCH, sub-protrusions SPR2, SPR4 or SPR6 facing the data connection holes DTCH, a sub-protrusion SPR3 overlapping an auxiliary connection hole ASCH, and a sub-protrusion SPR5 overlapping a first detour connection hole DECH1 or a second detour connection hole DECH2. Therefore, redundant description will be omitted.

A display device according to an embodiment may include a substrate, a circuit layer on the substrate, a light emitting element layer on the circuit layer, and a display driving circuit supplying data driving signals corresponding to data signals of data lines of the circuit layer.

The substrate may include a main area and a sub-area protruding from a side of the main area, and the main area may include a display area in which emission areas are arranged and a non-display area disposed around the display area.

The circuit layer may include pixel drivers respectively corresponding to the emission areas, the data lines transmitting the data signals to the pixel drivers, first dummy lines disposed in the display area and extending in a first direction intersecting the data lines, second dummy lines extending in a second direction parallel to the data lines and respectively neighboring the data lines, and demux circuit units disposed in a demux area of the non-display area, which is adjacent to the sub-area, and electrically connected between the display driving circuit and the data lines.

As described above, the display device according to an embodiment may include the demux circuit units electrically connected between the display driving circuit and the data lines. Each of the demux circuit units may output the data signals of the data lines based on a data driving signal of the display driving circuit. Accordingly, the data driving signals of the display driving circuit may not respectively correspond to the data lines, but may respectively correspond to the demux circuit units which are fewer in number than the data lines. Due to the demux circuit units, data supply lines respectively electrically connected to output terminals of the display driving circuit may be provided in smaller numbers than the data lines. Accordingly, a width allocated to the arrangement of the data supply lines in the non-display area can be reduced.

Therefore, it is possible to reduce the width of the non-display area without reducing the number of data lines, thereby eliminating limitations on resolution due to the width of the non-display area. A short-circuit defect between the data supply lines due to a reduction in the width of the non-display area can be prevented.

Further, according to an embodiment, some via holes among via holes for electrical connection between the first dummy lines and the second dummy lines may overlap one of the emission areas, and the other via holes are disposed in a non-emission area between the emission areas.

Therefore, the visibility of the via holes can be reduced, which, in turn, reduces a decrease in display quality due to the via holes.

According to an embodiment, the demux area may include a demux middle area in the middle, a first demux side area adjacent to a bent portion of an edge of the substrate, and a second demux side area disposed between the demux middle area and the first demux side area.

In this case, the demux circuit units may include a first demux circuit unit disposed in the first demux side area and a second demux circuit unit disposed in the second demux side area.

A first data supply line among the data supply lines may be electrically connected to the first demux circuit unit through an input detour line disposed in the display area.

On the other hand, a second data supply line among the data supply lines may be connected to the second demux circuit unit.

As described above, since the first data supply line is electrically connected to the first demux circuit unit of the first demux side area through the input detour line, it may extend to the second demux side area, like the second data supply line. Accordingly, the first data supply line may not be disposed in the first demux side area adjacent to the bent portion of the substrate. This may reduce a width of the first demux side area, thereby further reducing the width of the non-display area.

However, the effects of the disclosure are not restricted to those set forth herein. The above and other effects of the disclosure will become more apparent to one of daily skill in the art to which the disclosure pertains.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure.

What is claimed is:

1. A display device, comprising:
   a plurality of emission areas disposed in a display area, each of the plurality of emission areas includes a light emitting element;
   a plurality of data lines to which data voltages are applied;
   a plurality of first dummy lines disposed in the display area, extending in a first direction, and intersecting the plurality of data lines;
   a plurality of second dummy lines extending in a second direction crossing the first direction; and
   a plurality of via holes through which the first dummy lines and the second dummy lines are electrically connected, and
   wherein the plurality of via holes comprises a subset of via holes overlapping one of the plurality of emission areas, and another subset of via holes disposed in a non-emission area between the plurality of emission areas.

2. The display device of claim 1, further comprising:
   a display driving circuit configured to supply data driving signals corresponding to the data signals of the plurality of data lines; and
   demultiplexer (demux) circuits electrically connected between the display driving circuit and the plurality of data lines, and
   one of the demux circuits comprises:
   an input terminal electrically connected to the display driving circuit; and
   a first output terminal and a second output terminal that are electrically connected to two data lines of the plurality of data lines, respectively.

3. The display device of claim 2, further comprising:
   a plurality of data supply lines electrically connected to output terminals of the display driving circuit, wherein
   a first data supply line among the plurality of data supply lines is electrically connected to an input terminal of a first demux circuit of the demux circuits through a first detour line of the second dummy lines, and a second data supply line among the plurality of data supply lines is electrically connected to an input terminal of a second demux circuit of the demux circuits.

4. The display device of claim 3, wherein the first dummy lines comprises a second detour line extending in the first direction and electrically connected to the first detour line.

5. The display device of claim 4, wherein the second dummy lines comprises: the first detour line extending in the second direction and electrically connected to the first data supply line, and a third detour line extending in the second direction and electrically connected to the second detour line.

6. The display device of claim 5, further comprising:

a first power supply line and a second power supply line respectively transmitting first power and second power for driving the light emitting element of each of the plurality of emission areas, and first power auxiliary lines extending in the first direction and electrically connected to the first power supply line, wherein the first dummy lines further comprise first auxiliary lines electrically connected to the second power supply line, and the second dummy lines further comprise second power auxiliary lines extending in the first direction and electrically connected to the first power supply line.

7. The display device of claim 6, wherein the first detour line extends in the second direction between the first data supply line and the second detour line, and the second detour line extends in the first direction between the first detour line and the third detour line.

8. The display device of claim 7, wherein the second dummy lines include second auxiliary lines, and wherein the second auxiliary lines comprise:

general auxiliary lines extending between both ends of the display area in the second direction;

a first extension auxiliary line spaced apart from an end of the first detour line in the second direction; and a second extension auxiliary line spaced apart from an end of the third detour line in the second direction.

9. The display device of claim 8, wherein the plurality of data lines comprise:

a first data line and a second data line that are electrically connected to a first output terminal and a second output terminal of the first demux circuit, respectively; and a third data line and a fourth data line electrically connected to a first output terminal and a second output terminal of the second demux circuit, respectively, wherein each of the first data line and the third data line neighbors one of the general auxiliary lines on a side in the first direction, the second data line neighbors the third detour line and the second extension auxiliary line on the side in the first direction, and the fourth data line neighbors the first detour line and the first extension auxiliary line on the side in the first direction.

10. The display device of claim 9, wherein the via holes comprise:

a first detour connection hole through which the first detour line and the second detour line are electrically connected;

a second detour connection hole through which the second detour line and the third detour line are electrically connected; and auxiliary connection holes through which the first auxiliary lines and the second auxiliary lines are electrically connected.

11. The display device of claim 10, wherein the auxiliary connection holes comprise first auxiliary connection holes overlapping the general auxiliary lines, the first detour connection hole and the second detour connection hole are disposed in the non-emission area, and each of the first auxiliary connection holes overlaps one of the emission areas.

12. The display device of claim 11, wherein the auxiliary connection holes further comprise:

a second auxiliary connection hole overlapping the second extension auxiliary line; and a third auxiliary connection hole overlapping the first extension auxiliary line; and the second auxiliary connection hole and the third auxiliary connection hole are disposed in the non-emission area.

13. The display device of claim 11, wherein the first extension auxiliary line and the second extension auxiliary line are electrically connected to the second power supply line in a non-display area.

14. The display device of claim 10, wherein:

the auxiliary connection holes comprise first auxiliary connection holes overlapping the general auxiliary lines, each of the first detour connection hole and the second detour connection hole overlaps one of the emission areas, and the first auxiliary connection holes are disposed in the non-emission area.

15. The display device of claim 10, wherein first detour connection holes respectively overlapping adjacent second detour lines in the second direction are arranged in a first diagonal direction intersecting the first direction and the second direction, and second detour connection holes respectively overlapping adjacent second detour lines in the second direction are arranged in a second diagonal direction perpendicular to the first diagonal direction.

16. The display device of claim 10, wherein each of a plurality of pixel drivers is electrically connected to one of the plurality of data lines through a data connection hole, and each of the first data line and the second data line comprises:

a first main extension portion extending in the second direction; and a first sub-protrusion protruding from the first main extension portion and overlapping the data connection hole.

17. The display device of claim 16, wherein a general auxiliary line neighboring the first data line comprises:

a second main extension portion extending in the second direction;

a second sub-protrusion protruding from the second main extension portion and facing the first sub-protrusion of the first data line; and a third sub-protrusion facing the first main extension portion of the first data line and overlapping one first auxiliary connection hole among the auxiliary connection holes.

18. The display device of claims 16, wherein the third detour line neighboring the second data line comprises:

a third main extension portion extending in the second direction;

a fourth sub-protrusion protruding from the third main extension portion and facing the first sub-protrusion of the second data line; and a fifth sub-protrusion protruding from the third main extension portion, facing the first main extension portion of the second data line and overlapping the second detour connection hole.

19. The display device of claim 16, wherein the second extension auxiliary line neighboring the second data line comprises:

a fourth main extension portion extending in the second direction; and a sixth sub-protrusion protruding from the fourth main extension portion and facing the first sub-protrusion of the second data line, and the fourth main extension portion is electrically connected to the second power supply line in a non-display area.

20. An electronic device, comprising:

a display device for providing an image, wherein the display device comprises:

a plurality of emission areas disposed in a display area, each of the plurality of emission areas includes a light emitting element;

a plurality of data lines to which data voltages are applied;

a plurality of first dummy lines disposed in the display area, extending in a first direction, and intersecting the plurality of data lines;

a plurality of second dummy lines extending in a second direction crossing the first direction; and a plurality of via holes through which the first dummy lines and the second dummy lines are electrically connected, and the plurality of via holes comprises a subset of via holes overlapping one of the plurality of emission areas, and another subset of via holes disposed in a non-emission area between the plurality of emission areas.

* * * * *